(12) United States Patent
Shin et al.

(10) Patent No.: US 12,419,107 B2
(45) Date of Patent: Sep. 16, 2025

(54) PIXEL INCLUDING LIGHT EMITTING ELEMENTS AND DISPLAY DEVICE INCLUDING THE SAME

(71) Applicant: Samsung Display Co., LTD., Yongin-si (KR)

(72) Inventors: Min Gyeong Shin, Yongin-si (KR); Dong Woo Kim, Yongin-si (KR); Se Hyun Lee, Yongin-si (KR); Hak Sun Chang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 515 days.

(21) Appl. No.: 17/861,896

(22) Filed: Jul. 11, 2022

(65) Prior Publication Data

US 2023/0108716 A1 Apr. 6, 2023

(30) Foreign Application Priority Data

Oct. 1, 2021 (KR) .......................... 10-2021-0131183

(51) Int. Cl.
*H10D 86/60* (2025.01)
*H01L 25/16* (2023.01)
(Continued)

(52) U.S. Cl.
CPC .......... *H10D 86/60* (2025.01); *H01L 25/167* (2013.01); *H10D 86/441* (2025.01); *H01L 24/24* (2013.01);
(Continued)

(58) Field of Classification Search
None
See application file for complete search history.

(56) References Cited

U.S. PATENT DOCUMENTS 9,570,425 B2 2/2017 Do
10,461,123 B2 * 10/2019 Kim ...................... H10D 86/60
(Continued)

FOREIGN PATENT DOCUMENTS

KR 10-1436123 11/2014
KR 10-2020-0013824 A 2/2020
(Continued)

*Primary Examiner* — Bo B Jang
(74) *Attorney, Agent, or Firm* — Womble Bond Dickinson (US) LLP

(57) ABSTRACT

A pixel may include a first line component, a second line component, a third line component, and a fourth line component that are spaced apart from each other on a substrate and extend in a direction, a conductive pattern disposed on the first and the second line components, a passivation layer disposed on the conductive pattern, a first electrode disposed on the passivation layer and directly contacting the conductive pattern, a second electrode disposed adjacent to the first electrode and spaced apart from the first electrode, and a third electrode disposed adjacent to the second electrode, and spaced apart from the second electrode, and electrically connected to the third line component, a first pixel electrode and a second pixel electrode that are disposed on the first to the third electrodes and spaced apart from each other, and light emitting elements electrically connected to the first and the second pixel electrodes.

20 Claims, 13 Drawing Sheets

(51) Int. Cl.
 *H10D 86/40* (2025.01)
 *H10H 20/825* (2025.01)
 *H10H 20/857* (2025.01)
 *H01L 23/00* (2006.01)

(52) U.S. Cl.
 CPC .... *H01L 24/25* (2013.01); *H01L 2224/24051* (2013.01); *H01L 2224/24145* (2013.01); *H01L 2224/25175* (2013.01); *H10H 20/8252* (2025.01); *H10H 20/857* (2025.01)

(56) References Cited

U.S. PATENT DOCUMENTS

| | | | |
|---|---|---|---|
| 10,943,947 B2 * | 3/2021 | Im | H01L 25/167 |
| 10,991,865 B2 | 4/2021 | Kim et al. | |
| 11,552,063 B2 | 1/2023 | Kim et al. | |
| 11,749,709 B2 * | 9/2023 | Heo | H10H 20/857 |
| | | | 257/79 |
| 12,183,857 B2 | 12/2024 | Kim et al. | |
| 2021/0242381 A1 | 8/2021 | Lee et al. | |
| 2021/0343784 A1 | 11/2021 | Kwag et al. | |

FOREIGN PATENT DOCUMENTS

| | | |
|---|---|---|
| KR | 10-2020-0042997 | 4/2020 |
| KR | 10-2020-0078398 A | 7/2020 |
| KR | 10-2021-0057891 A | 5/2021 |
| KR | 10-2021-0098313 A | 8/2021 |

* cited by examiner

PIXEL INCLUDING LIGHT EMITTING ELEMENTS AND DISPLAY DEVICE INCLUDING THE SAME

CROSS-REFERENCE TO RELATED APPLICATION(S)

This application claims priority to and benefits of Korean patent application number 10-2021-0131183 under 35 U.S.C. § 119, filed on Oct. 1, 2021, in the Korean Intellectual Property Office, the entire contents of which are incorporated herein by reference.

BACKGROUND

Technical Field

Various embodiments of the disclosure relate to a pixel and a display device including the pixel.

Description of Related Art

Recently, as interest in information display increases, research and development of display devices has been continuous.

SUMMARY

Various embodiments of the disclosure are directed to a pixel having improved reliability, and a display device including the pixel.

A pixel in accordance with an embodiment may include a first line component, a second line component, a third line component, and a fourth line component that are spaced apart from each other on a substrate and extend in a direction, a conductive pattern disposed on the first and the second line components, a passivation layer disposed on the conductive pattern, a first electrode disposed on the passivation layer and directly contacting the conductive pattern, a second electrode disposed adjacent to the first electrode and spaced apart from the first electrode, a third electrode disposed adjacent to the second electrode and spaced apart from the second electrode, the third electrode being electrically connected to the third line component, a first pixel electrode and a second pixel electrode that are disposed on the first to the third electrodes and spaced apart from each other, and light emitting elements electrically connected to the first and the second pixel electrodes.

In an embodiment, the pixel may further include an emission area in which the light emitting elements are disposed, a non-emission area disposed adjacent to the emission area, and a bank disposed in the non-emission area, the bank including a first opening corresponding to the emission area, and a second opening spaced apart from the first opening. Each of the first and the third electrodes may be divided into parts in the second opening.

In an embodiment, the first line component may include an initialization power line to which an initialization voltage may be applied. The second line component may include a data line to which a data voltage may be applied. The third line component may include a second power line to which a second power supply may be applied. The fourth line component may include a first power line to which a first power supply different from the second power supply may be applied. The first power supply may be a high-potential driving power supply, and the second power supply may be a low-potential driving power supply.

In an embodiment, the pixel may further include a buffer layer disposed on the substrate, a gate insulating layer disposed on the buffer layer, an interlayer insulating layer disposed on the gate insulating layer, and the passivation layer disposed on the interlayer insulating layer. The first, the second, the third, and the fourth line components may be disposed between the substrate and the buffer layer. The conductive pattern may be disposed between the gate insulating layer and the interlayer insulating layer.

In an embodiment, the conductive pattern may overlap the first and the second line components.

In an embodiment, the first electrode may be electrically connected to the conductive pattern through a contactor successively passing through the passivation layer and the interlayer insulating layer.

In an embodiment, the contactor may overlap the bank.

In an embodiment, the pixel may further include an insulating layer disposed on the first, the second, and the third electrodes, and including a first contact hole formed to expose an area of the first electrode, and a second contact hole formed to expose an area of the second electrode. The first pixel electrode may be electrically connected to the first electrode through the first contact hole. The second pixel electrode may be electrically connected to the second electrode through the second contact hole.

In an embodiment, the first contact hole and the second contact hole may be positioned in the second opening of the bank.

In an embodiment, the second electrode may include a 2-1-th electrode and a 2-2-th electrode that diverge from the non-emission area to the emission area.

In an embodiment, the pixel may further include at least one transistor disposed on the buffer layer and electrically connected to the light emitting elements.

In an embodiment, a gate electrode of the transistor and the conductive pattern may be disposed on a same layer.

In an embodiment, the pixel may further include an intermediate electrode disposed between the first pixel electrode and the second pixel electrode, the intermediate electrode being spaced apart from each of the first pixel electrode and the second pixel electrode.

In an embodiment, the intermediate electrode may include a first intermediate electrode, a second intermediate electrode, and a third intermediate electrode disposed at positions spaced apart from each other.

In an embodiment, the light emitting elements may include a first light emitting element disposed between the first pixel electrode and the first intermediate electrode, and electrically connected to the first pixel electrode and the first intermediate electrode, a second light emitting element disposed between the first intermediate electrode and the second intermediate electrode, and electrically connected to the first intermediate electrode and the second intermediate electrode, a third light emitting element disposed between the second intermediate electrode and the third intermediate electrode, and electrically connected to the second intermediate electrode and the third intermediate electrode, and a fourth light emitting element disposed between the third intermediate electrode and the second pixel electrode, and electrically connected to the third intermediate electrode and the second pixel electrode.

In an embodiment, the intermediate electrode may include a first intermediate electrode adjacent to the first pixel electrode, a second intermediate electrode adjacent to the second pixel electrode, and a connection electrode that electrically connects the first intermediate electrode to the second intermediate electrode. The first intermediate electrode, the second intermediate electrode, and the connection electrode may be integral to each other.

In an embodiment, the light emitting elements may include a first light emitting element disposed between the first pixel electrode and the first intermediate electrode, and electrically connected to the first pixel electrode and the first intermediate electrode, and a second light emitting element disposed between the second intermediate electrode and the second pixel electrode, and electrically connected to the second intermediate electrode and the second pixel electrode.

A display device in accordance with an embodiment may include pixel areas each including an emission area and a non-emission area, and a pixel disposed in each of the pixel areas. The pixel may include a first line component, a second line component, a third line component, and a fourth line component that may be spaced apart from each other on a substrate and extend in a direction, a buffer layer disposed on the first to the fourth line components, a conductive pattern disposed on a surface of the buffer layer and overlapping the first and the second line components, a passivation layer disposed on the conductive pattern, a first electrode disposed on the passivation layer and directly contacting the conductive pattern, a second electrode disposed adjacent to the first electrode and spaced apart from the first electrode, a third electrode disposed adjacent to the second electrode and spaced apart from the second electrode, the third electrode being electrically connected to the third line component, a bank disposed in the non-emission area, the bank including a first opening corresponding to the emission area, and a second opening spaced apart from the first opening, a first pixel electrode and a second pixel electrode that are disposed on the first to the third electrodes and spaced apart from each other, and light emitting elements electrically connected to the first and the second pixel electrodes.

In an embodiment, the first line component may include an initialization power line to which an initialization voltage may be applied. The second line component may include a data line to which a data voltage may be applied. The third line component may include a second power line to which a second power supply may be applied. The fourth line component may include a first power line to which a first power supply different from the second power supply may be applied. The first power supply may be a high-potential driving power supply, and the second power supply may be a low-potential driving power supply.

In an embodiment, the first electrode may be electrically connected to the conductive pattern through a contactor passing through the passivation layer. The contactor may overlap the bank.

DETAILED DESCRIPTION OF THE EMBODIMENTS

Figure 1:
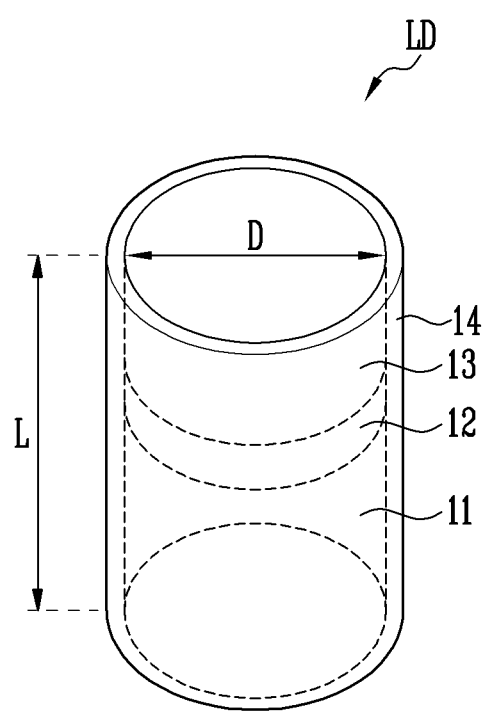
FIG. 1 is a perspective view schematically illustrating a light emitting element in accordance with an embodiment.

Embodiments and details of the disclosure are described with reference to the accompanying drawings in order to describe the disclosure in detail so that those having ordinary knowledge in the technical field to which the disclosure pertains may practice the disclosure.

References to a singular form may include a plural form as long as the context does not clearly indicate otherwise.

As the disclosure allows for various changes and numerous embodiments, particular embodiments will be illustrated in the drawings and described in detail in the written description. However, this is not intended to limit the disclosure to particular modes of practice, and it is to be appreciated that all changes, equivalents, and substitutes that do not depart from the spirit and scope of the disclosure are encompassed in the disclosure.

Throughout the disclosure, like reference numerals refer to like elements throughout the various figures and embodiments of the disclosure. The sizes of elements in the accompanying drawings may be exaggerated for clarity of illustration. It will be understood that, although the terms "first", "second", and the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof. Furthermore, in case that a first part such as a layer, a film, a region, or a plate is disposed on a second part, the first part may be not only directly on the second part but a third part may intervene between them. In case that it is expressed that a first part such as a layer, a film, a region, or a plate is formed on a second part, the surface of the second part on which the first part is formed is not limited to an upper surface of the second part but may include other surfaces such as a side surface or a lower surface of the second part. In case that a first part such as a layer, a film, a region, or a plate is under a second part, the first part may be not only directly under the second part but a third part may intervene between them.

It will be understood that when an element (e.g., a first element) is referred to as being (operatively or communicatively) "coupled with/to," or "connected with/to" another element (e.g., a second element), the first element may be coupled or connected with/to the second element directly or via another element (e.g., a third element). In contrast, it will be understood that when an element (e.g., a first element) is referred to as being "directly coupled with/to" or "directly connected with/to" another element (e.g., a second element), no other element (e.g., a third element) may intervene between the element and the other element.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

When an element is described as "not overlapping" or "to not overlap" another element, this may include that the elements are spaced apart from each other, offset from each other, or set aside from each other or any other suitable term as would be appreciated and understood by those of ordinary skill in the art.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

"About" or "approximately" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
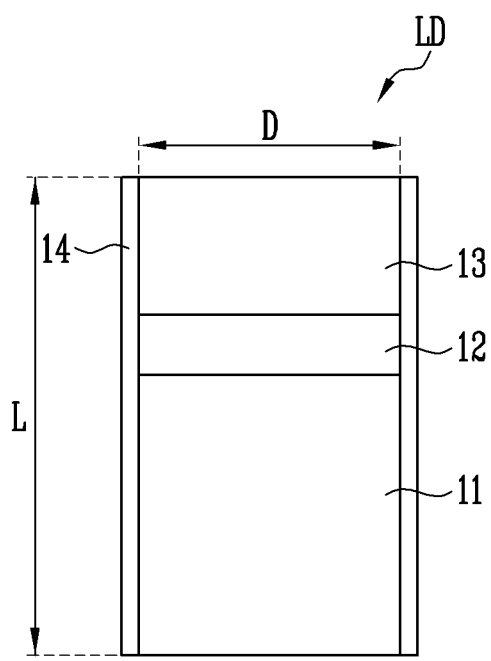
FIG. 2 is a schematic cross-sectional diagram illustrating the light emitting element of FIG. 1.

FIG. 1 is a perspective view schematically illustrating a light emitting element LD in accordance with an embodiment. FIG. 2 is a schematic cross-sectional view illustrating the light emitting element LD of FIG. 1.

In an embodiment, the type and/or shape of the light emitting element LD is not limited to an embodiment illustrated in FIGS. 1 and 2.

Referring to FIGS. 1 and 2, the light emitting element LD may include a first semiconductor layer 11, a second semiconductor layer 13, and an active layer 12 interposed between the first and second semiconductor layers 11 and 13. For example, the light emitting element LD may be implemented as an emission stack (or referred to as "stack") formed by successively stacking the first semiconductor layer 11, the active layer 12, and the second semiconductor layer 13.

The light emitting element LD may be formed to extend in a direction. If the direction in which the light emitting element LD extends is defined as a longitudinal direction, the light emitting element LD may have an end (or a lower end or first end) and a remaining end (or an upper end or second end) in the longitudinal direction. One of the first and second semiconductor layers 11 and 13 may be disposed on the first end of the light emitting element LD, and the other of the first and second semiconductor layers 11 and 13 may be disposed on the second end of the light emitting element LD. For example, the first semiconductor layer 11 may be disposed on the first end of the light emitting element LD, and the second semiconductor layer 13 may be disposed on the second end of the light emitting element LD.

The light emitting element LD may have various shapes. For example, as illustrated in FIG. 1, the light emitting element LD may have a rod-like shape, a bar-like shape, or a pillar-like shape which is long (for example, to have an aspect ratio greater than 1) in the longitudinal direction. In an embodiment, a length L of the light emitting element LD with respect to the longitudinal direction may be greater than a diameter D (or a width of a cross-section) thereof. However, the disclosure is not limited thereto. In an embodiment, the light emitting element LD may have a rod-like shape, a bar-like shape, or a pillar-like shape which is short in the longitudinal direction (for example, to have an aspect ratio less than 1). In an embodiment, the light emitting element LD may have a rod-like shape, a bar-like shape, or a pillar-like shape in which the length L thereof and the diameter D thereof are the same as each other.

The light emitting element LD may include a light-emitting diode (LED) fabricated to have a subminiature size, e.g., with a diameter D and/or a length L ranging from the nanoscale (or nanometer) to the microscale (or micrometer).

In case that the light emitting element LD is long (for example, to have an aspect ratio greater than 1) in the longitudinal direction, the diameter D of the light emitting element LD may range from about 0.5 μm to about 6 μm, and the length L thereof may range from about 1 μm to about 10 μm. However, the diameter D and length L of the light emitting element LD are not limited thereto. The size of the light emitting element LD may be changed to meet requirements (or design conditions) of a lighting device or a self-emissive display device to which the light emitting element LD is applied.

The first semiconductor layer 11 may include, for example, at least one n-type semiconductor layer. For instance, the first semiconductor layer 11 may include an n-type semiconductor layer which includes at least one semiconductor material of InAlGaN, GaN, AlGaN, InGaN, AlN, and InN and may be doped with a first conductive dopant (or an n-type dopant) such as Si, Ge, or Sn. However, the material of the first semiconductor layer 11 is not limited thereto, and various other materials may be used to form the first semiconductor layer 11. The first semiconductor layer 11 may include, in the longitudinal direction of the light emitting element LD, an upper surface that contacts the active layer 12, and a lower surface exposed to the outside.

The active layer 12 may be disposed on the first semiconductor layer 11 and have a single or multiple quantum well structure. For example, in case that the active layer 12 has a multiple quantum well structure, the active layer 12 may be formed by periodically repeatedly stacking a barrier layer (not shown), a strain reinforcing layer, and a well layer which are provided (disposed) as a part. The strain reinforcing layer may have a lattice constant less than that of the barrier layer so that strain, e.g., compressive strain, to be applied to the well layer may be further reinforced. However, the structure of the active layer 12 is not limited to that of the foregoing embodiment.

The active layer 12 may emit light having a wavelength ranging from about 400 nm to about 900 nm, and use a double hetero structure. In an embodiment, a clad layer doped with a conductive dopant may be formed over or under the active layer 12 in the longitudinal direction of the light emitting element LD. For example, the cladding layer may be formed of an AlGaN layer or an InAlGaN layer. In an embodiment, material such as AlGaN or InAlGaN may be used to form the active layer 12, and various other materials may be used to form the active layer 12. The active layer 12 may include a first surface which contacts the first semiconductor layer 11, and a second surface which contacts the second semiconductor layer 13.

If an electric field having a voltage or more is applied to the opposite ends of the light emitting element LD, the light emitting element LD may emit light by coupling or combining of electron-hole pairs in the active layer 12. Since light emission of the light emitting element LD may be controlled based on the foregoing principle, the light emitting element LD may be used as a light source (a light emitting source) of various light emitting devices as well as a pixel of a display device.

The second semiconductor layer 13 may be disposed on the second surface of the active layer 12 and include a semiconductor layer having a type different from that of the first semiconductor layer 11. For example, the second semiconductor layer 13 may include at least one p-type semiconductor layer. For instance, the second semiconductor layer 13 may include a p-type semiconductor layer which includes at least one semiconductor material of InAlGaN, GaN, AlGaN, InGaN, AlN, and InN, and may be doped with a second conductive dopant (or a p-type dopant) such as Mg, Zn, Ca, Sr, or Ba. However, the material for forming the second semiconductor layer 13 is not limited thereto, and various other materials may be used to form the second semiconductor layer 13. The second semiconductor layer 13 may include, in the longitudinal direction of the light emitting element LD, a lower surface that contacts the second surface of the active layer 12, and an upper surface exposed to the outside.

In an embodiment, the first semiconductor layer 11 and the second semiconductor layer 13 may have different thicknesses with respect to the longitudinal direction of the light emitting element LD. For example, the first semiconductor layer 11 may have a thickness greater than that of the second semiconductor layer 13 with respect to the longitudinal direction of the light emitting element LD. Hence, the active layer 12 of the light emitting element LD may be disposed at a position closer to the upper surface of the second semiconductor layer 13 than to the lower surface of the first semiconductor layer 11.

Although the first semiconductor layer 11 and the second semiconductor layer 13 each may be formed of a single layer, the disclosure is not limited thereto. In an embodiment, depending on the material of the active layer 12, the first semiconductor layer 11 and the second semiconductor layer 13 each may further include one or more layers, for example, a clad layer and/or a tensile strain barrier reducing (TSBR) layer. The TSBR layer may be a strain relief layer of which a lattice structure is disposed between other semiconductor layers so that the strain relief layer functions as a buffer layer to reduce a difference in lattice constant. Although the TSBR layer may be formed of a p-type semiconductor layer such as p-GaInP, p-AlInP, or p-AlGaInP, the disclosure is not limited thereto.

In an embodiment, the light emitting element LD may further include a contact electrode (not illustrated, and hereinafter referred to as "first contact electrode") disposed over the second semiconductor layer 13, as well as including the first semiconductor layer 11, the active layer 12, and the second semiconductor layer 13. Furthermore, in an embodiment, the light emitting element LD may further include another contact electrode (not illustrated, and hereinafter referred to as "second contact electrode") disposed on the first end of the first semiconductor layer 11.

Each of the first and second contact electrodes may be an ohmic contact electrode, but the disclosure is not limited thereto. In an embodiment, each of the first and second contact electrodes may be a Schottky contact electrode. The first and second contact electrodes may include conductive material. For example, the first and second contact electrodes may include opaque metal such as chromium (Cr), titanium (Ti), aluminum (Al), gold (Au), nickel (Ni), and oxides or alloys thereof, which may be used alone or in combination, but the disclosure is not limited thereto. In an embodiment, the first and second contact electrodes may also include transparent conductive oxides such as indium tin oxide (ITO), indium zinc oxide (IZO), zinc oxide ($ZnO_x$), indium gallium zinc oxide (IGZO), indium tin zinc oxide (ITZO), or a combination thereof. Here, the zinc oxide ($ZnO_x$) may be a zinc oxide (ZnO) and/or a zinc peroxide ($ZnO_2$).

Materials included in the first and second contact electrodes may be equal to or different from each other. The first and second contact electrodes may be substantially transparent or translucent. Therefore, light generated from the light emitting element LD may pass through the first and second contact electrodes and be emitted outside the light emitting element LD. In some embodiments, in case that light generated from the light emitting element LD is emitted outside the light emitting element LD through an area other than the opposite ends of the light emitting element LD rather than passing through the first and second contact electrodes, the first and second contact electrodes may include opaque metal.

In an embodiment, the light emitting element LD may further include an insulating layer 14 (or referred to as "insulating film"). However, in some embodiments, the insulating layer 14 may be omitted, or may be provided to cover (overlap) only part of the first semiconductor layer 11, the active layer 12, and the second semiconductor layer 13.

The insulating layer 14 may prevent the active layer 12 from short-circuiting due to making contact with conductive material except the first and second semiconductor layers 13. Furthermore, the insulating layer 14 may minimize a surface defect of the light emitting element LD, thus enhancing the lifespan and emission efficiency of the light emitting element LD. In case that multiple light emitting elements LD are disposed in close contact with each other, the insulating layer 14 may prevent an undesired short circuit from occurring between the light emitting elements LD. It is not limited whether the insulating layer 14 is provided or not, so long as the active layer 12 may be prevented from short-circuiting with external conductive material.

The insulating layer 14 may be provided to enclose an overall outer circumferential surface of the emission stack including the first semiconductor layer 11, the active layer 12, and the second semiconductor layer 13.

Although in the foregoing embodiment the insulating layer 14 has been described as enclosing the entirety of the respective outer circumferential surfaces of the first semiconductor layer 11, the active layer 12, and the second semiconductor layer 13, the disclosure is not limited thereto. In an embodiment, in case that the light emitting element LD includes the first contact electrode, the insulating layer 14 may enclose the entirety of the respective outer circumferential surfaces of the first semiconductor layer 11, the active layer 12, the second semiconductor layer 13, and the first contact electrode. In an embodiment, the insulating layer 14 may not enclose the entirety of the outer circumferential surface of the first contact electrode, or may enclose only a portion of the outer circumferential surface of the first contact electrode but not enclose another portion of the outer circumferential surface of the first contact electrode. Furthermore, in an embodiment, in case that the first contact electrode is disposed on the second end (or the upper end) of the light emitting element LD and the second contact electrode is disposed on the first end (or the lower end) of the light emitting element LD, the insulating layer 14 may allow at least one area of each of the first and second contact electrodes to be exposed.

The insulating layer 14 may include a transparent insulating material. For example, the insulating layer 14 may include one or more insulating materials selected from the group of silicon oxide ($SiO_x$), silicon nitride ($SiN_x$), silicon oxynitride ($SiO_xN_y$), aluminum oxide ($AlO_x$), titanium oxide ($TiO_x$), hafnium oxide ($HfO_x$), titanstrontium oxide ($SrTiO_x$), cobalt oxide ($Co_xO_y$), magnesium oxide (MgO), zinc oxide ($ZnO_x$), ruthenium Oxide ($RuO_x$), nickel oxide (NiO), tungsten oxide ($WO_x$), tantalum oxide ($TaO_x$), gadolinium oxide ($GdO_x$), zirconium oxide ($ZrO_x$), gallium oxide ($GaO_x$), vanadium oxide ($V_xO_y$), ZnO:Al, ZnO:B, InxOy:H, niobium oxide ($Nb_xO_y$), magnesium fluoride ($MgF_x$), aluminum fluoride ($AlF_x$), an alucone polymer film, titanium nitride (TiN), tantalum nitride (TaN), aluminum nitride ($AlN_x$), gallium nitride (GaN), tungsten nitride (WN), hafnium nitride (HfN), niobium nitride (NbN), gadolinium nitride (GdN), zirconium nitride (ZrN), and vanadium nitride (VN). However, the disclosure is not limited thereto, and various materials having insulation may be used as the material of the insulating layer 14. Here, the zinc oxide ($ZnO_x$) may be zinc oxide (ZnO) and/or zinc peroxide ($ZnO_2$).

The insulating layer 14 may be provided in the form of a single layer or in the form of multiple layers including at least double layers. For example, in case that the insulating layer 14 is formed of a double layer structure including a first layer and a second layer that are successively stacked, the first layer and the second layer may be made of different materials (or substances) and be formed through different processes. In an embodiment, the first layer and the second layer may include the same material and be formed through a successive process.

In an embodiment, the light emitting element LD may be implemented as a light emitting pattern having a core-shell structure. The first semiconductor layer 11 may be disposed in a core of the light emitting element LD, e.g., a central portion of the light emitting element LD. The active layer 12 may be provided and/or formed to enclose the outer circumferential surface of the first semiconductor layer 11. The second semiconductor layer 13 may be provided and/or formed to enclose the active layer 12. Furthermore, the light emitting element LD may further include a contact electrode (not illustrated) formed to enclose at least one side of the second semiconductor layer 13. In an embodiment, the light emitting element LD may further include an insulating layer 14 which may be provided on the outer circumferential surface of the light emitting pattern having a core-shell structure and has a transparent insulating material. The light emitting element LD implemented as the light emitting pattern having the core-shell structure may be fabricated in a growth manner.

The light emitting element LD may be employed as a light emitting source (or a light source) for various display devices. The light emitting element LD may be fabricated through a surface treatment process. For example, the light emitting element LD may be surface-treated so that, in case that multiple light emitting elements LD are mixed with a fluidic solution (or solvent) and supplied to each pixel area (e.g., an emission area of each pixel or an emission area of each sub-pixel), the light emitting elements LD may be evenly distributed rather than unevenly aggregating in the solution.

A light emitting unit (or a light emitting device) including the light emitting element LD described above may be used in various types of devices including a display device which requires a light source. For instance, in case that multiple light emitting elements LD are disposed in the pixel area of each pixel of a display panel, the light emitting elements LD may be used as a light source of the pixel. However, the application field of the light emitting element LD is not limited to the above-mentioned examples. For example, the light emitting element LD may also be used in other types of electronic devices such as a lighting device, which requires a light source.

Figure 3:
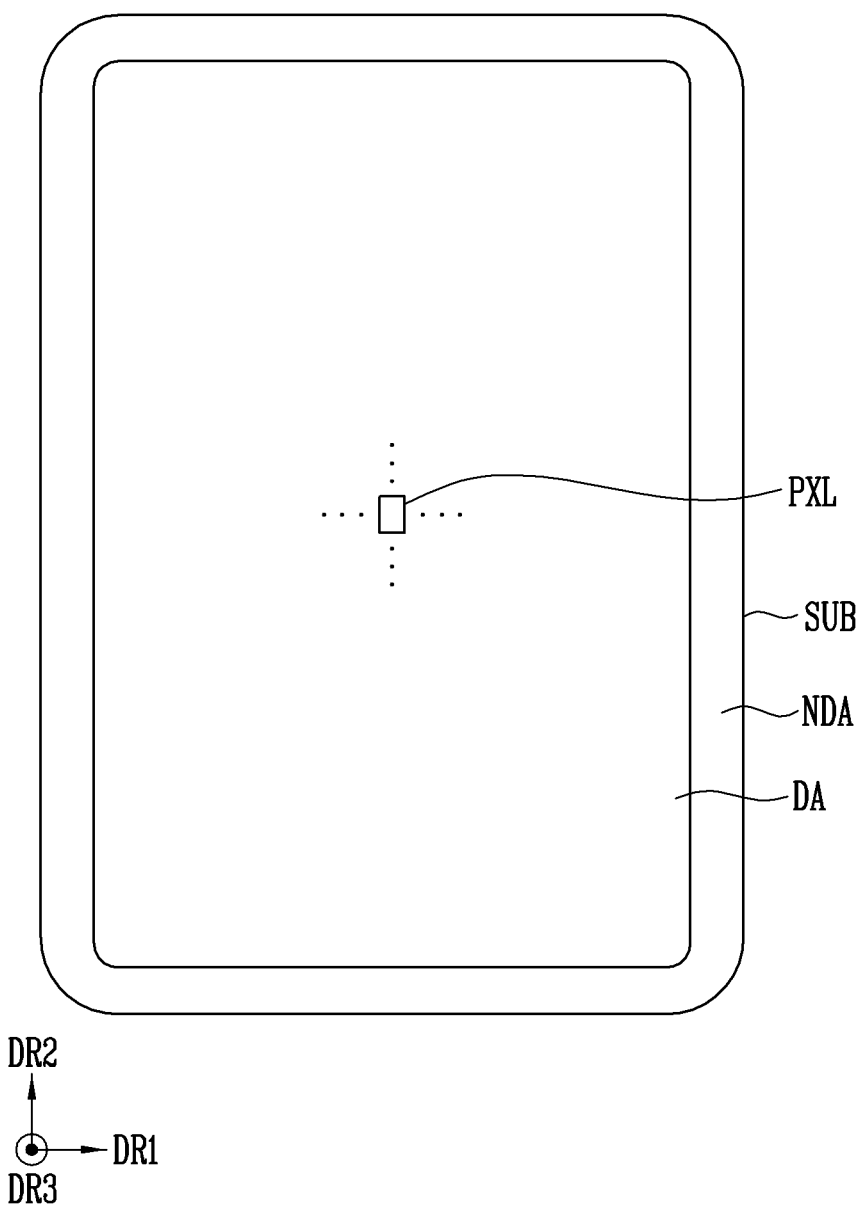
FIG. 3 is a plan view schematically illustrating a display device in accordance with an embodiment.

FIG. 3 is a plan view schematically illustrating a display device in accordance with an embodiment.

For the sake of explanation, FIG. 3 schematically illustrates the structure of the display device, focused on a display area DA on which an image may be displayed.

If the display device is an electronic device having a display surface on at least one surface thereof, e.g., a smartphone, a television, a tablet PC, a mobile phone, a video phone, an electronic reader, a desktop PC, a laptop PC, a netbook computer, a workstation, a server, a PDA, a portable multimedia player (PMP), an MP3 player, a medical appliance, a camera, or a wearable device, the disclosure may be applied to the display device.

Referring to FIGS. 1 to 3, the display device may include a substrate SUB, pixels PXL provided in the substrate SUB and each including at least one light emitting element LD, a driver provided in the substrate SUB and driving the pixels PXL, and a fan-out line component provided to connect the pixels PXL with the driver.

The display device may be classified into a passive matrix type display device and an active matrix type display device according to a method of driving the light emitting element LD. For example, in case that the display device is implemented as an active matrix type, each of the pixels PXL may include a driving transistor controlling the amount of current to be supplied to the light emitting element LD, and a switching transistor transmitting a data signal to the driving transistor.

The display device may be provided in various forms, for example, in the form of a rectangular plate having two pairs of parallel sides, but the disclosure is not limited thereto. In case that the display device is provided in the form of a rectangular plate, a pair of sides of the pairs of sides may be longer than another. For the sake of explanation, there is illustrated the case where the display device has a rectangular shape with a pair of long sides and a pair of short sides. A direction in which the long sides extend is indicated by a second direction DR2, a direction in which the short sides extend is indicated by a first direction DR1, and a thickness-wise direction of the substrate SUB is indicated by a third direction DR3. In the display device provided in a rectangular planar shape, each corner on which a long side and a short side contact (or meet) each other may have a round shape.

The substrate SUB may include a display area DA and a non-display area NDA.

The display area DA may be an area in which the pixels PXL for displaying an image may be provided. The non-display area NDA may be an area in which the driver for driving the pixels PXL and a portion of the fan-out line component for connecting the pixels PXL to the driver may be provided. For the sake of explanation, FIG. 3 illustrates only one pixel PXL, but multiple pixels PXL may be substantially provided in the display area DA of the substrate SUB.

The non-display area NDA may be provided at one or more sides of the display area DA. The non-display area NDA may enclose the perimeter (or edges) of the display area DA. The fan-out line component electrically connected to the pixels PXL, and the driver electrically connected to the fan-out line component and driving the pixels PXL may be provided in the non-display area NDA.

The fan-out line component may electrically connect the driver with the pixels PXL. The fan-out line component may include fan-out lines electrically connected with signal lines, e.g., a scan line, a data line, and an emission control line, which may be electrically connected to each pixel PXL to provide signals to the pixel PXL. Furthermore, the fan-out line component may include fan-out lines electrically connected to signal lines, e.g., a control line, and a sensing line, which may be electrically connected to each pixel PXL to compensate in real time for variation in electrical characteristics of the pixel PXL.

The substrate SUB may include a transparent insulating material to allow light transmission. The substrate SUB may be a rigid substrate or a flexible substrate.

An area on the substrate SUB may be provided as the display area DA in which the pixels PXL may be disposed, and another area on the substrate may be provided as the non-display area NDA. For example, the substrate SUB may include a display area DA including multiple pixel areas in which the respective pixels PXL may be disposed, and a non-display area NDA disposed around the perimeter of the display area DA (or adjacent to the display area DA).

The pixels PXL may be provided in the display area DA on the substrate SUB. In an embodiment, the pixels PXL may be arranged in the display area DA in a stripe arrangement manner, but the disclosure is not limited thereto.

Each of the pixels PXL may include at least one light emitting element LD that is driven in response to a corresponding scan signal and a corresponding data signal. The light emitting element LD may have a small size ranging from the nanoscale to the microscale and be electrically connected in parallel to light emitting elements LD disposed adjacent thereto, but the disclosure is not limited thereto. The light emitting element LD may form a light source of each pixel PXL.

Each of the pixels PXL may include at least one light source, e.g., the light emitting element LD illustrated in FIG. 1, which may be driven by a signal (e.g., a scan signal and a data signal) and/or a power supply (e.g., a first driving power supply and a second driving power supply). However, in an embodiment, the type of the light emitting element LD which may be used as a light source of each pixel PXL is not limited thereto.

The driver may provide a signal and a power voltage to each of the pixels PXL through the fan-out line component and thus control the operation of the pixel PXL.

Figure 4:
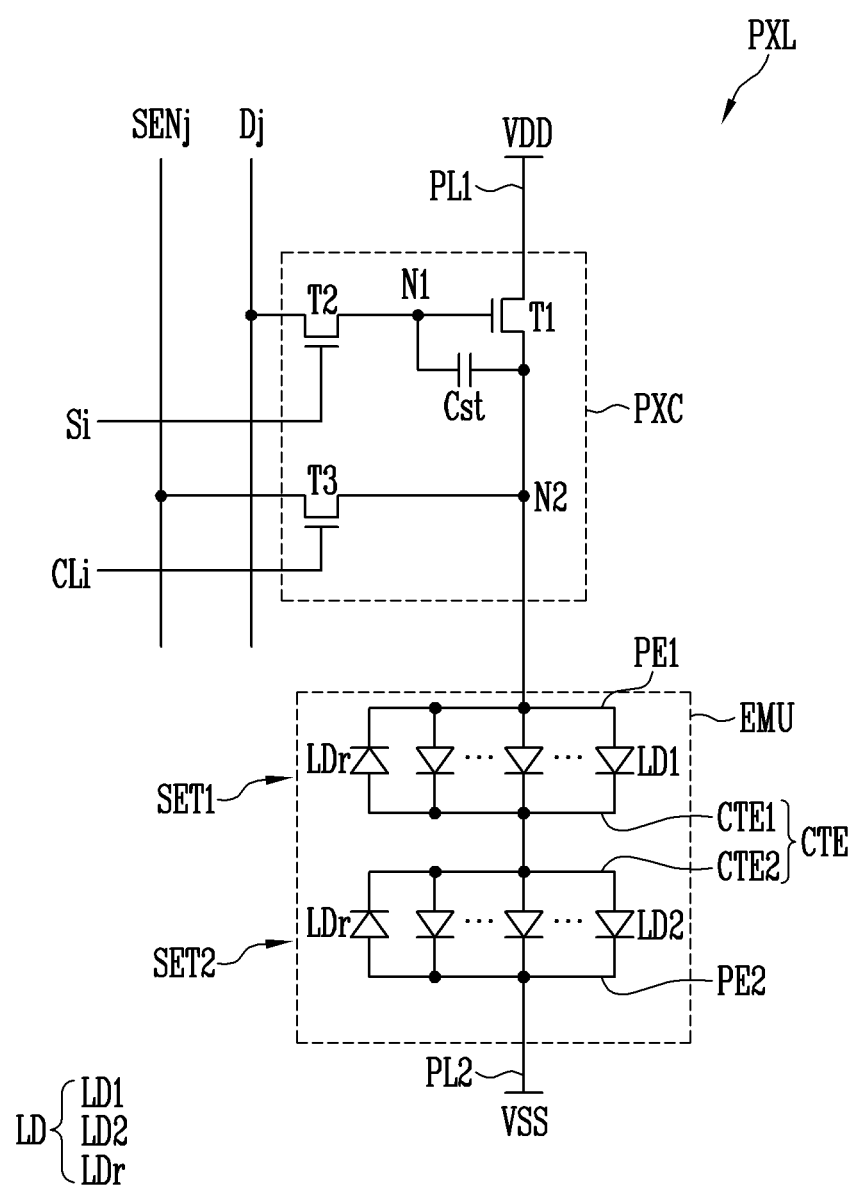
FIGS. 4 and 5 are schematic circuit diagrams illustrating various embodiments of an electrical connection relationship of components included in each pixel illustrated in FIG. 3.
Figure 5:
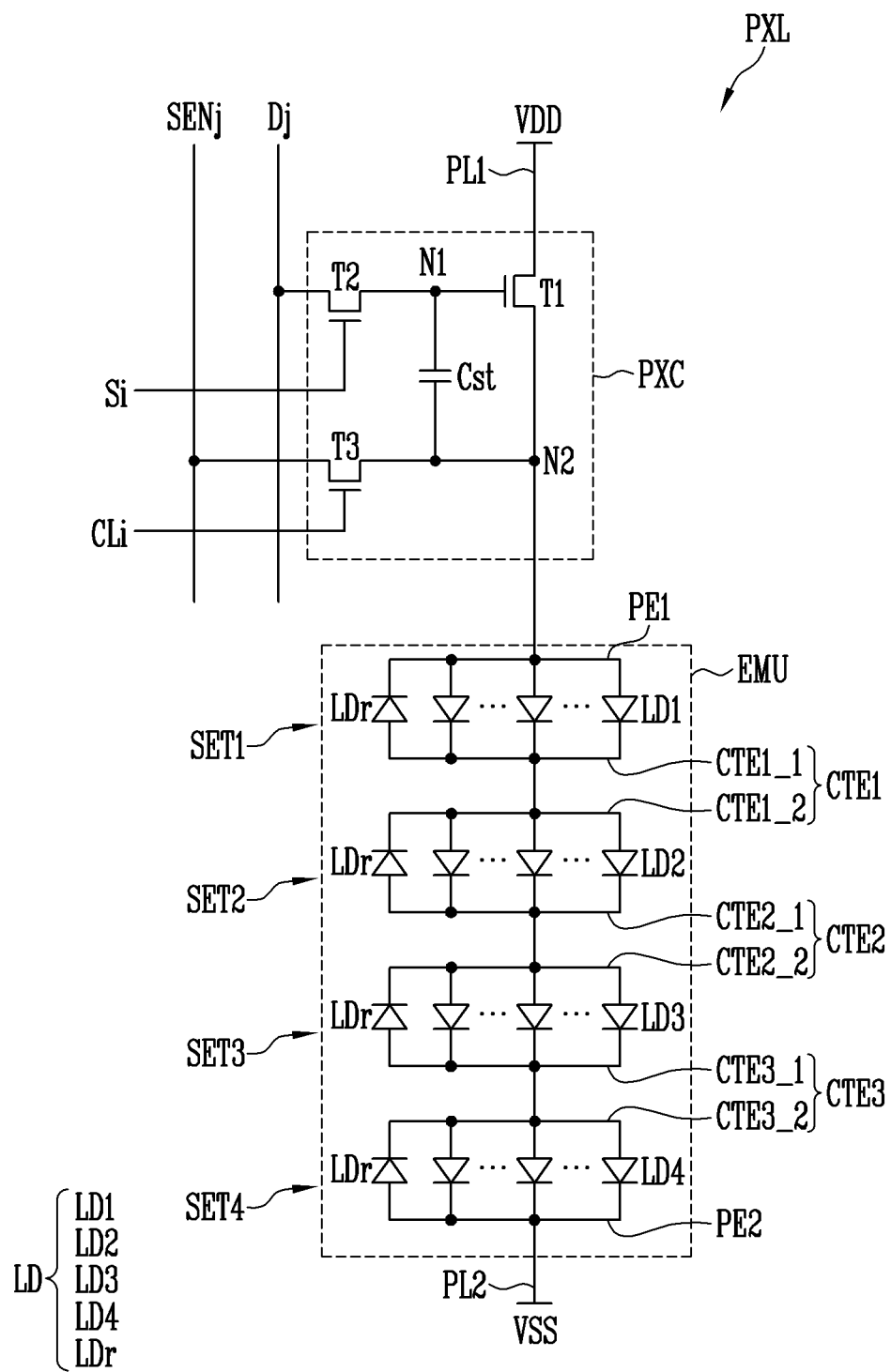

FIGS. 4 and 5 are schematic circuit diagrams illustrating various embodiments of an electrical connection relationship of components included in the pixel PXL illustrated in FIG. 3.

For example, FIGS. 4 and 5 illustrate various embodiments of the electrical connection relationship of components included in the pixel PXL that may be employed in an active matrix type display device. However, the types of the components included in the pixel PXL which may be applied to an embodiment may be applied are not limited thereto.

In FIGS. 4 and 5, not only the components included in the pixel PXL illustrated in FIG. 3 but also an area in which the components are provided may be embraced in the definition of the term "pixel PXL".

Referring to FIGS. 1 to 5, the pixel PXL may include an emission unit EMU (or an emission part) generating light having a luminance corresponding to a data signal. Furthermore, the pixel PXL may selectively further include a pixel circuit PXC driving the emission unit EMU.

In an embodiment, the emission unit EMU may include multiple light emitting elements LD electrically connected in parallel between a first power line PL1 which may be electrically connected to a first driving power supply VDD and to which a voltage of the first driving power supply VDD may be applied, and a second power line PL2 which may be electrically connected to a second driving power supply VSS and to which a voltage of the second driving power supply VSS may be applied. For example, the emission unit EMU may include a first pixel electrode PE1 electrically connected to the first driving power supply VDD via the pixel circuit PXC and the first power line PL1, a second pixel electrode PE2 electrically connected to the second driving power supply VSS by the second power line PL2, and multiple light emitting elements LD electrically connected in parallel to each other in the same direction between the first and second pixel electrodes PE1 and PE2. In an embodiment, the first pixel electrode PE1 may be an anode, and the second pixel electrode PE2 may be a cathode.

Each of the light emitting elements LD included in the emission unit EMU may include an end electrically connected to the first driving power supply VDD by the first pixel electrode PE1, and another end electrically connected to the second driving power supply VSS by the second pixel electrode PE2. The first driving power supply VDD and the second driving power supply VSS may have different potentials. For example, the first driving power supply VDD may be set as a high-potential power supply, and the second driving power supply VSS may be set as a low-potential power supply. Here, a difference in potential between the first and second driving power supplies VDD and VSS may be set to a value equal to or greater than a threshold voltage of the light emitting elements LD during an emission period of the pixel PXL.

As described above, the light emitting elements LD that may be electrically connected in parallel to each other in the same direction (e.g., in a forward direction) between the first pixel electrode PE1 and the second pixel electrode PE2 to which the voltages of the different power supplies may be respectively supplied may form respective valid light sources.

The light emitting elements LD of the emission unit EMU may emit light having a luminance corresponding to driving current supplied thereto through the pixel circuit PXC. For example, during each frame period, the pixel circuit PXC may supply driving current corresponding to a gray scale value of corresponding frame data to the emission unit EMU. The driving current supplied to the emission unit EMU may be divided into parts which flow into the respective light emitting elements LD. Hence, each of the light emitting elements LD may emit light having a luminance corresponding to current applied thereto, so that the emission unit EMU may emit light having a luminance corresponding to the driving current.

Although there has been described an embodiment in which the opposite ends of the light emitting elements LD are electrically connected in the same direction between the first and second driving power supplies VDD and VSS, the disclosure is not limited thereto. In an embodiment, the emission unit EMU may further include at least one invalid light source, e.g., a reverse light emitting element LDr, as well as including the light emitting elements LD that form the respective valid light sources. The reverse light emitting element LDr, along with the light emitting elements LD that form the valid light sources, may be electrically connected in parallel to each other between the first and second pixel electrodes PE1 and PE2. Here, the reverse light emitting element LDr may be electrically connected between the first and second pixel electrodes PE1 and PE2 in a direction opposite to that of the light emitting elements LD. Even if a driving voltage (e.g., a forward driving voltage) is applied between the first and second pixel electrodes PE1 and PE2, the reverse light emitting element LDr remains disabled. Hence, current substantially may not flow through the reverse light emitting element LDr.

The pixel circuit PXC may be electrically connected to a scan line Si and a data line Dj of the pixel PXL. The pixel circuit PXC may be electrically connected to a control line CLi and a sensing line SENj of the pixel PXL. For example, in case that the pixel PXL is disposed on an i-th row and a j-th column of the display area DA, the pixel circuit PXC of the pixel PXL may be electrically connected to an i-th scan line Si, a j-th data line Dj, an i-th control line CLi, and a j-th sensing line SENj of the display area DA.

The pixel circuit PXC may include first to third transistors T1 to T3, and a storage capacitor Cst.

The first transistor T1 may be a driving transistor that controls driving current to be applied to the emission unit EMU and may be electrically connected between the first driving power supply VDD and the emission unit EMU. In detail, a first terminal of the first transistor T1 may be electrically connected (or coupled) to the first driving power supply VDD by the first power line PL1. A second terminal of the first transistor T1 may be electrically connected to a second node N2. A gate electrode of the first transistor T1 may be electrically connected to a first node N1. The first transistor T1 may control, in response to a voltage applied to the first node N1, the amount of driving current to be applied from the first driving power supply VDD to the emission unit EMU by the second node N2. In an embodiment, the first terminal of the first transistor T1 may be a drain electrode, and the second terminal of the first transistor T1 may be a source electrode, and the disclosure is not limited thereto. In an embodiment, the first terminal may be a source electrode, and the second terminal may be a drain electrode.

The second transistor T2 may be a switching transistor which selects a pixel PXL in response to a scan signal and activates the pixel PXL, and may be electrically connected between the data line Dj and the first node N1. A first terminal of the second transistor T2 may be electrically connected to the data line Dj. A second terminal of the second transistor T2 may be electrically connected to the first node N1. A gate electrode of the second transistor T2 may be electrically connected to the scan line Si. The first terminal and the second terminal of the second transistor T2 may be different terminals, and, for example, if the first terminal is a drain electrode, the second terminal may be a source electrode.

In case that a scan signal having a gate-on voltage (e.g., a high level voltage) is supplied from the scan line Si, the second transistor T2 may be turned on to electrically connect the data line Dj with the first node N1. The first node N1 may be a point at which the second terminal of the second transistor T2 and the gate electrode of the first transistor T1 are electrically connected to each other. The second transistor T2 may transmit a data signal to the gate electrode of the first transistor T1.

The third transistor T3 may obtain a sensing signal through the sensing line SENj by connecting the first transistor T1 to the sensing line SENj, and detect, using the sensing signal, characteristics of the pixel PXL such as a threshold voltage of the first transistor T1. Information about the characteristics of the pixel PXL may be used to convert image data such that a deviation in characteristic between pixels PXL may be compensated for. A second terminal of the third transistor T3 may be electrically connected to the second terminal of the first transistor T1. A first terminal of the third transistor T3 may be electrically connected to the sensing line SENj. A gate electrode of the third transistor T3 may be electrically connected to the control line CLi. Furthermore, the first terminal of the third transistor T3 may be electrically connected to an initialization power line to which a voltage of an initialization power supply may be applied. The third transistor T3 may be an initialization transistor that initializes the second node N2, and may be turned on in case that a sensing control signal is supplied thereto from the control line CLi, so that the voltage of the initialization power supply may be transmitted to the second node N2. Hence, a second storage electrode of the storage capacitor Cst electrically connected to the second node N2 may be initialized.

A first storage electrode of the storage capacitor Cst may be electrically connected to the first node N1. The second storage electrode of the storage capacitor Cst may be electrically connected to the second node N2. The storage capacitor Cst may be charged with a data voltage corresponding to a data signal to be supplied to the first node N1 during a frame period. Hence, the storage capacitor Cst may store a voltage corresponding to a difference between a voltage of the gate electrode of the first transistor T1 and a voltage of the second node N2.

The emission unit EMU may include at least one serial set (or stage) including multiple light emitting elements LD electrically connected in parallel to each other. In other words, as illustrated in FIGS. 4 and 5, the emission unit EMU may have a serial/parallel combination structure.

Referring to FIG. 4, the emission unit EMU may include first and second serial sets SET1 and SET2 which may be successively connected between the first and second driving power supplies VDD and VSS. Each of the first and second serial sets SET1 and SET2 may include two electrodes PE1 and CTE1, CTE2 and PE2 that form an electrode pair of the corresponding serial set, and multiple light emitting elements LD electrically connected in parallel to each other in the same direction between the two electrodes PE1 and CTE1, CTE2 and PE2.

The first serial set (or the first stage) SET1 may include a first pixel electrode PE1, a first intermediate electrode CTE1, and at least one first light emitting element LD1 electrically connected between the first pixel electrode PE1 and the first intermediate electrode CTE1. Furthermore, the first serial set SET1 may include a reverse light emitting element LDr electrically connected between the first pixel electrode PE1 and the first intermediate electrode CTE1 in a direction opposite to that of the first light emitting element LD1.

The second serial set (or the second stage) SET2 may include a second intermediate electrode CTE2, a second pixel electrode PE2, and at least one second light emitting element LD2 electrically connected between the second intermediate electrode CTE2 and the second pixel electrode PE2. Furthermore, the second serial set SET2 may include a reverse light emitting element LDr electrically connected between the second intermediate electrode CTE2 and the second pixel electrode PE2 in a direction opposite to that of the second light emitting element LD2.

The first intermediate electrode CTE1 and the second intermediate electrode CTE2 may be electrically and/or physically connected with each other. The first intermediate electrode CTE1 and the second intermediate electrode CTE2 may form an intermediate electrode CTE that may electrically connect the first serial set SET1 and the second serial set SET2 that may be successively provided.

In the foregoing embodiment, the first pixel electrode PE1 of the first serial set SET1 may be an anode of each pixel PXL, and the second pixel electrode PE2 of the second serial set SET2 may be a cathode of the corresponding pixel PXL.

As described above, the emission unit EMU of the pixel PXL including the serial sets SET1 and SET2 (or the light emitting elements LD) electrically connected to each other in the serial/parallel combination structure may adjust driving current/voltage conditions in response to specifications of a product to which the emission unit EMU is to be applied.

Particularly, the emission unit EMU of the pixel PXL including the serial sets SET1 and SET2 (or the light emitting elements LD) electrically connected to each other in the serial/parallel combination structure may reduce driving current, compared to that of the emission unit EMU having a structure such that the light emitting elements LD may be electrically connected only in parallel to each other. Furthermore, the emission unit EMU of the pixel PXL including the serial sets SET1 and SET2 electrically connected to each other in the serial/parallel combination structure may reduce driving current to be applied to the opposite ends of the emission unit EMU, compared to that of the emission unit having a structure such that all of the light emitting elements LD, the number of which is the same as that of the emission unit EMU, may be electrically connected in series to each other. The emission unit EMU of the pixel PXL including the serial sets SET1 and SET2 (or the light emitting elements LD) electrically connected to each other in the serial/parallel combination structure may increase the number of light emitting elements LD included between the electrodes PE1, CTE1, CTE2, and PE2, compared to that of the emission unit having a structure such that all of the serial sets (or stages) may be electrically connected in series to each other. The light output efficiency of the light emitting elements LD may be enhanced. Even if a defect is caused in a specific serial set (or stage), the ratio of light emitting elements LD that cannot emit light due to the defect may be reduced, so that a reduction in the light output efficiency of the light emitting elements LD may be mitigated.

Although in the foregoing embodiment there has been described the emission unit EMU including the first serial set SET1 and the second serial set SET2, the disclosure is not limited thereto. In an embodiment, as illustrated in FIG. 5, the emission unit EMU may include a first serial set SET1, a second serial set SET2, a third serial set SET3, and a fourth serial set SET4.

Referring to FIG. 5, the emission unit EMU may include first to fourth serial sets SET1, SET2, SET3, and SET4 which may be successively connected between the first and second driving power supplies VDD and VSS. Each of the first to fourth serial sets SET1, SET2, SET3, and SET4 may include two electrodes PE1 and CTE1_1, CTE1_2 and CTE2_1, CTE2_2 and CTE3_1, and CTE3_2 and PE2 that form an electrode pair of the corresponding serial set, and multiple light emitting elements LD electrically connected in parallel to each other in the same direction between the two electrodes PE1 and CTE1_1, CTE1_2 and CTE2_1, CTE2_2 and CTE3_1, and CTE3_2 and PE2.

The first serial set (or the first stage) SET1 may include a first pixel electrode PE1, a 1-1-th intermediate electrode CTE1_1, and at least one first light emitting element LD1 electrically connected between the first pixel electrode PE1 and the 1-1-th intermediate electrode CTE1_1. Furthermore, the first serial set SET1 may include a reverse light emitting element LDr connected between the first pixel electrode PE1 and the 1-1-th intermediate electrode CTE1_1 in a direction opposite to that of the first light emitting element LD1.

The second serial set (or the second stage) SET2 may include a 1-2-th intermediate electrode CTE1_2, a 2-1-th intermediate electrode CTE2_1, and at least one second light emitting element LD2 electrically connected between the 1-2-th intermediate electrode CTE1_2 and the 2-1-th intermediate electrode CTE2_1. Furthermore, the second serial set SET2 may include a reverse light emitting element LDr connected between the 1-2-th intermediate electrode CTE1_2 and the 2-1-th intermediate electrode CTE2_1 in a direction opposite to that of the second light emitting element LD2.

The 1-1-th intermediate electrode CTE1_1 and the 1-2-th intermediate electrode CTE1_2 may be electrically and/or physically connected with each other. The 1-1-th intermediate electrode CTE1_1 and the 1-2-th intermediate electrode CTE1_2 may form a first intermediate electrode CTE1 that may electrically connect the first serial set SET1 and the second serial set SET2 that may be successively provided.

The third serial set (or the third stage) SET3 may include a 2-2-th intermediate electrode CTE2_2, a 3-1-th intermediate electrode CTE3_1, and at least one third light emitting element LD3 electrically connected between the 2-2-th intermediate electrode CTE2_2 and the 3-1-th intermediate electrode CTE3_1. Furthermore, the third serial set SET3 may include a reverse light emitting element LDr connected between the 2-2-th intermediate electrode CTE2_2 and the 3-1-th intermediate electrode CTE3_1 in a direction opposite to that of the third light emitting element LD3.

The 2-1-th intermediate electrode CTE2_1 and the 2-2-th intermediate electrode CTE2_2 may be electrically and/or physically connected with each other. The 2-1-th intermediate electrode CTE2_1 and the 2-2-th intermediate electrode CTE2_2 may form a second intermediate electrode CTE2 that may electrically connect the second serial set SET2 and the third serial set SET3 that may be successively provided.

The fourth serial set (or the fourth stage) SET4 may include a 3-2-th intermediate electrode CTE3_2, a second pixel electrode PE2, and at least one fourth light emitting element LD4 electrically connected between the 3-2-th intermediate electrode CTE3_2 and the second pixel electrode PE2. Furthermore, the fourth serial set SET4 may include a reverse light emitting element LDr connected between the 3-2-th intermediate electrode CTE3_2 and the second pixel electrode PE2 in a direction opposite to that of the fourth light emitting element LD4.

The 3-1-th intermediate electrode CTE3_1 and the 3-2-th intermediate electrode CTE3_2 may be electrically and/or physically connected with each other. The 3-1-th intermediate electrode CTE3_1 and the 3-2-th intermediate electrode CTE3_2 may form a third intermediate electrode CTE3 that may electrically connect the third serial set SET3 and the fourth serial set SET4 that may be successively provided.

In the foregoing embodiment, the first pixel electrode PE1 of the first serial set SET1 may be an anode of the emission unit EMU, and the second pixel electrode PE2 of the fourth serial set SET4 may be a cathode of the emission unit EMU.

Although FIGS. 4 and 5 illustrate an embodiment where all of the first to third transistors T1, T2, and T3 included in the pixel circuit PXC are formed of N-type transistors, the disclosure is not limited thereto. For example, at least one of the first to third transistors T1, T2, and T3 may be changed to a P-type transistor. Furthermore, although FIGS. 4 and 5 illustrate an embodiment where the emission unit EMU is electrically connected between the pixel circuit PXC and the second driving power supply VSS, the emission unit EMU may be electrically connected between the first driving power supply VDD and the pixel circuit PXC.

The structure of the pixel circuit PXC may be changed in various ways. For example, the pixel circuit PXC may further include at least one transistor element such as a transistor element that initializes the first node N1, and/or a transistor element that controls an emission time of the light emitting elements LD, or other circuit elements such as a boosting capacitor for boosting the voltage of the first node N1.

The structure of the pixel PXL to which an embodiment may be applied is not limited to the embodiments illustrated in FIGS. 4 and 5, and the pixel PXL may have various structures. For example, the pixel PXL may be configured in a passive light emitting display device, or the like. The pixel circuit PXC may be omitted, and the opposite ends of the light emitting elements LD included in the emission unit EMU may be directly electrically connected to the scan line Si, the data line Dj, the first power line PL1 to which a voltage of the first driving power supply VDD is to be applied, the second power line PL2 to which a voltage of the second driving power supply VSS is to be applied, and/or a control line.

Figure 6:
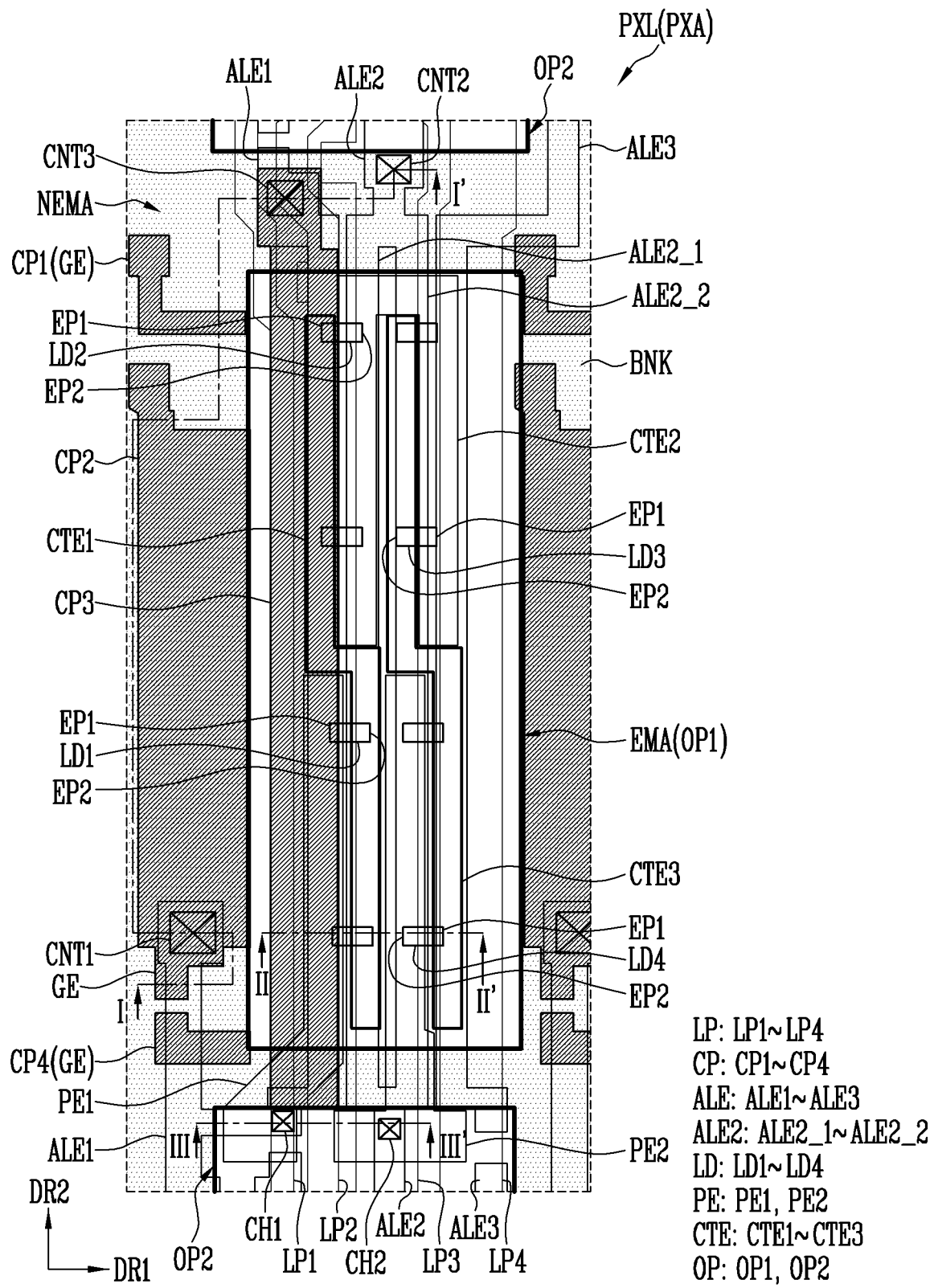
FIG. 6 is a plan view schematically illustrating each pixel illustrated in FIG. 3.
Figure 7:
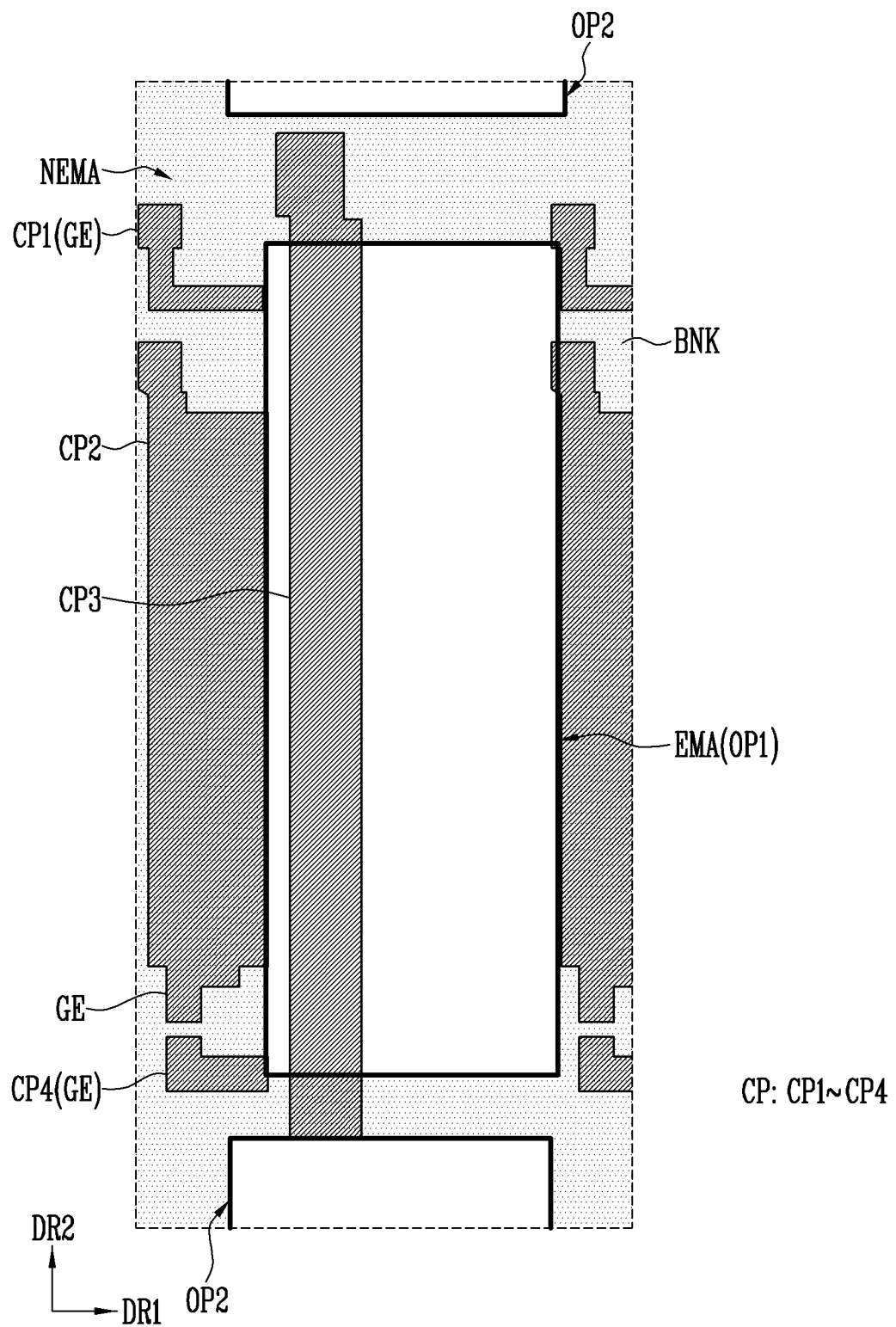
FIG. 7 is a plan view schematically illustrating part of the components of the pixel of FIG. 6.

FIG. 6 is a plan view schematically illustrating each pixel PXL illustrated in FIG. 3. FIG. 7 is a plan view schematically illustrating only part of the components of the pixel PXL of FIG. 6.

In an embodiment, for the sake of explanation, a transverse direction (or a horizontal direction) in a plan view is indicated by a first direction DR1, and a longitudinal direction (or a vertical direction) in a plan view is indicated by a second direction DR2.

In an embodiment, the term "connection" between two components may include electrical connection and physical connection, but the disclosure is not limited thereto.

Referring to FIGS. 3, and 5 to 7, the pixel PXL may be disposed in a pixel area PXA provided in the substrate SUB. The pixel area PXA may include an emission area EMA and a non-emission area NEMA.

A line component LP electrically connected to the pixel PXL may be disposed on the substrate SUB. The line component LP may include first, second, third, and fourth line components LP1, LP2, LP3, and LP4 that transmit signals to the pixel PXL.

The first, second, third, and fourth line components LP1, LP2, LP3, and LP4 may extend in the second direction DR2. The first, second, third, and fourth line components LP1, LP2, LP3, and LP4 may be successively disposed in the first direction DR1. The first, second, third, and fourth line components LP1, LP2, LP3, and LP4 may be spaced apart from each other and electrically separated from each other. In an embodiment, the first line component LP1 may include an initialization power line to which a voltage of an initialization power supply may be applied. The second line component LP2 may include a data line to which a data signal is applied. The third line component LP3 may include a second power line to which a voltage of a second driving power supply is applied. The fourth line component LP4 may include a first power line to which a voltage of a first driving power supply is applied. The first driving power supply may be the first driving power supply VDD described with reference to FIGS. 4 and 5. The second driving power supply may be the second driving power supply VSS described with reference to FIGS. 4 and 5.

The first line component LP1 may be electrically connected to one or more components of the pixel circuit PXC. For example, the first line component LP1 may be electrically connected to the third transistor T3 provided in the pixel circuit PXC.

The second line component LP2 may be electrically connected to other components of the pixel circuit PXC. For example, the second line component LP2 may be electrically connected to the second transistor T2 provided in the pixel circuit PXC.

The third line component LP3 may be electrically connected to a second alignment electrode ALE2 through a second contactor CNT2 in an upper portion of the non-emission area NEMA. The second contactor CNT2 may be formed by removing a portion of at least one insulating layer disposed between the second alignment electrode ALE2 and the third line component LP3.

The fourth line component LP4 may be electrically connected to other components of the pixel circuit PXC. For example, the fourth line component LP4 may be electrically connected to the first transistor T1 provided in the pixel circuit PXC.

The pixel PXL may include a conductive pattern CP disposed in the pixel area PXA. The conductive pattern CP may include first, second, and fourth conductive patterns CP1, CP2, and CP4 disposed in at least the non-emission area NEMA, and a third conductive pattern CP3 disposed in at least the emission area EMA. The first conductive pattern CP1, the second conductive pattern CP2, the third conductive pattern CP3, and the fourth conductive pattern CP4 may be spaced apart from each other and electrically separated from each other.

Based on a surface of the substrate SUB on which the pixel PXL may be provided, the line component LP and the conductive pattern CP may be provided in the order listed.

The line component LP may be a first conductive layer disposed on the substrate SUB. The conductive pattern CP may be a second conductive layer disposed on the substrate SUB. The first conductive layer and/or the second conductive layer may have a single-layer structure formed of one or more members of the group of copper (Cu), molybdenum (Mo), tungsten (W), aluminum neodymium (AlNd), titanium (Ti), aluminum (Al), silver (Ag), and an alloy thereof, or may have a double-layer or multi-layer structure formed of molybdenum (Mo), titanium (Ti), copper (Cu), aluminum (Al), and/or silver (Ag) to reduce line resistance.

The first conductive pattern CP1 may be a gate electrode GE of the second transistor T2 that overlaps a semiconductor layer (or a semiconductor pattern) of the second transistor T2 to define a channel area.

The second conductive pattern CP2 may be a gate electrode GE of the first transistor T1 that overlaps a semiconductor layer (or a semiconductor pattern) of the first transistor T1 to define a channel area. Furthermore, the second conductive pattern CP2 may be a first storage electrode (or a lower electrode) of the storage capacitor Cst included in the pixel circuit PXC. A second storage electrode (or an upper electrode) of the storage capacitor Cst may be disposed on the second conductive pattern CP2.

The fourth conductive pattern CP4 may be a gate electrode GE of the third transistor T3 that overlaps a semiconductor layer (or a semiconductor pattern) of the third transistor T3 to define a channel area.

The third conductive pattern CP3 may extend in the second direction DR2 in the emission area EMA and overlap the first and second line components LP1 and LP2. The third conductive pattern CP3 may be disposed in at least the emission area EMA, and extend from the emission area EMA to a portion of the non-emission area NEMA and overlap a bank BNK. The third conductive pattern CP3 may partially overlap at least one alignment electrode ALE, e.g., the first alignment electrode ALE1, and have an expanded shape to be adjacent to the bank BNK in at least the emission area EMA. For example, the third conductive pattern CP3 may have an expanded shape sufficient to cover the first and second line components LP1 and LP2, and be more adjacent to the non-emission area NEMA than to the first alignment electrode ALE1.

The third conductive pattern CP3 may be provided in each pixel PXL. Each third conductive pattern CP3 may be electrically separated from the third conductive pattern CP3 that is provided in an adjacent pixel PXL.

In an embodiment, the third conductive pattern CP3 may be electrically connected to the first alignment electrode ALE1 through a third contactor CNT3 in at least the non-emission area NEMA. Hence, during a process of aligning the light emitting elements LD in the emission area EMA, an alignment signal to be applied to the first alignment electrode ALE1 may be applied to the third conductive pattern CP3. In other words, during the process of aligning the light emitting elements LD, an identical alignment signal may be applied to each of the first alignment electrode ALE1 and the third conductive pattern CP3.

The third contactor CNT3 may be formed by removing a portion of at least one insulating layer disposed between the third conductive pattern CP3 and the first alignment electrode ALE1.

The pixel PXL may include a bank BNK disposed in the non-emission area NEMA.

The bank BNK may be a structure for defining (or partitioning) the respective pixel areas PXA (or the respective emission areas EMA) of the pixel PXL and pixels PXL adjacent thereto and, for example, may be a pixel defining layer.

In an embodiment, the bank BNK may be a pixel defining layer or a dam structure for defining each emission area EMA to which the light emitting elements LD are to be supplied, during a process of supplying (or inputting) the light emitting elements LD to the pixel PXL. For example, since the emission area EMA of the pixel PXL is defined by the bank BNK, a mixed solution (e.g., ink) including a target amount and/or type of light emitting elements LD may be supplied (or input) to the emission area EMA.

The bank BNK may include at least one light blocking material and/or reflective material, thus preventing a light leakage defect in which light (or rays) leaks between the pixel PXL and the pixels PXL adjacent thereto. In an embodiment, the bank BNK may include a transparent material (or substance). The transparent material may include, for example, polyamides resin, polyimides resin, etc., or a combination thereof, but the disclosure is not limited thereto. In an embodiment, in order to enhance the efficiency of light emitted from each pixel PXL, a separate reflective material layer may be provided and/or formed on the bank BNK.

The bank BNK may include, in the pixel area PXA, at least one opening OP which exposes components disposed thereunder. For example, the bank BNK may include a first opening OP1 and a second opening OP2 which expose components disposed under the bank BNK in the pixel area PXA. In an embodiment, the emission area EMA of the pixel PXL and the first opening OP1 of the bank BNK may correspond to each other.

In the pixel area PXA, the second opening OP2 may be disposed at a position spaced apart from the first opening OP1, and disposed adjacent to a side of the pixel area PXA. In an embodiment, the second opening OP2 may be an electrode separation area where at least one alignment electrode ALE may be separated from at least one alignment electrode ALE provided in pixels PXL adjacent thereto in the second direction DR2.

The pixel PXL may include pixel electrodes PE and intermediate electrodes CTE which are provided in at least the emission area EMA, light emitting elements LD electrically connected between the pixel electrodes PE and the intermediate electrodes CTE, and alignment electrodes ALE provided at positions corresponding to the pixel electrodes PE and the intermediate electrodes CTE. For example, the pixel PXL may include first and second pixel electrodes PE1 and PE2, first to third intermediate electrodes CTE1, CTE2, and CTE3, light emitting elements LD, first to third alignment electrodes ALE1, ALE2, and ALE3 which are provided in at least the emission area EMA. The pixel electrodes PE, the intermediate electrodes CTE, the alignment electrodes ALE each may be changed in number, shape, size, arrangement structure, etc. in various ways depending on the structure of the pixel PXL (particularly, the emission unit EMU).

In an embodiment, based on a surface of the substrate SUB on which the pixel PXL may be provided, the line component LP, the conductive pattern CP, the alignment electrodes ALE, the light emitting elements LD, the pixel electrodes PE, and/or the intermediate electrodes CTE may be provided in the order listed, but the disclosure is not limited thereto. The positions and formation sequence of the electrode patterns and/or insulating patterns that form the pixel PXL may be changed in various ways depending on embodiments.

Description of a stacked structure of the pixel PXL will be described below with reference to FIGS. 8 to 11.

The alignment electrodes ALE may be disposed in at least the emission area EMA, and be spaced apart from each other with respect to the first direction DR1 in the emission area EMA, and each may extend in the second direction DR2. Furthermore, the alignment electrodes ALE may be separated, by removing a portion thereof in the second opening OP2 of the bank BNK, from the alignment electrodes ALE provided in the pixels PXL that are adjacent to each other in the second direction DR2.

In an embodiment, the alignment electrodes ALE may include a first alignment electrode ALE1 (or a first electrode), a second alignment electrode ALE2 (or a second electrode), and a third alignment electrode ALE3 (or a third electrode) which may be arranged at positions spaced apart from each other in the first direction DR1.

The first alignment electrode ALE1 (or the first electrode) may be separated, in the second opening OP2 (or the electrode separation area) of the bank BNK, from the first alignment electrodes ALE1 provided in the pixels PXL adjacent thereto in the second direction DR2.

The second alignment electrode ALE2 (or the second electrode) may be electrically connected, in the second opening OP2 (or the electrode separation area) of the bank BNK, to the second alignment electrodes ALE2 provided in the pixels PXL adjacent thereto in the second direction DR2. The second alignment electrode ALE2 may include a 2-1-th alignment electrode ALE2_1 and a 2_2-th alignment electrode ALE2_2 which diverge from the non-emission area NEMA to the emission area EMA. The 2-1-th alignment electrode ALE2_1 and the 2-2-th alignment electrode ALE2_2 may be integrally provided.

The third alignment electrode ALE3 (or the third electrode) may be separated, in the second opening OP2 (or the electrode separation area) of the bank BNK, from the third alignment electrodes ALE3 provided in the pixels PXL adjacent thereto in the second direction DR2.

The first alignment electrode ALE1 may be electrically connected to one or more components (or the fourth line component LP4) of the pixel circuit PXC through a first contactor CTN1 in the non-emission area NEMA. The first contactor CNT1 may be formed by removing a portion of at least one insulating layer disposed between the first alignment electrode ALE1 and the one or more components of the pixel circuit PXC. The first alignment electrode ALE1 may be electrically connected to the first pixel electrode PE1 through a first contact hole CH1 in the second opening OP2 of the bank BNK. The first contact hole CH1 may be formed by removing a portion of at least one insulating layer disposed between the first alignment electrode ALE1 and the first pixel electrode PE1. In an embodiment, the first alignment electrode ALE1 may be electrically connected to the third conductive pattern CP3 through the third contactor CNT3.

The second alignment electrode ALE2 may be electrically connected to the third line component LP3 through the second contactor CNT2 in the upper portion of the non-emission area NEMA. The second contactor CNT2 may be formed by removing a portion of at least one insulating layer disposed between the second alignment electrode ALE2 and the third line component LP3. The second alignment electrode ALE2 may be electrically connected to the second pixel electrode PE2 through a second contact hole CH2 in the second opening OP2 of the bank BNK. The second contact hole CH2 may be formed by removing a portion of at least one insulating layer disposed between the second alignment electrode ALE2 and the second pixel electrode PE2.

The first, second, and third contactors CNT1, CNT2, and CNT3 may be disposed in the non-emission area NEMA and overlap the bank BNK. The disclosure is not limited thereto. In an embodiment, the first, second, and third contactors CNT1, CNT2, and CNT3 may be disposed in the second opening OP2 of the bank BNK that is an electrode separation area.

The first contact hole CH1 and the second contact hole CH2 may be disposed in the second opening OP2 of the bank BNK, but the disclosure is not limited thereto. In an embodiment, the first contact hole CH1 and the second contact hole CH2 may be disposed in the emission area EMA.

A pair of alignment electrodes ALE adjacent to each other may be supplied with different signals at the step of aligning the light emitting elements LD and be spaced apart from each other.

The first alignment electrode ALE1 and the 2-1-th alignment electrode ALE2_1 may make a pair and receive different alignment signals. The 2-2-th alignment electrode ALE2_2 and the third alignment electrode ALE3 may make a pair and receive different alignment signals. In at least the emission area EMA, the first alignment electrode ALE1 and the 2-1-th alignment electrode ALE2_1 may be spaced apart from each other by a distance in the first direction DR1, and the 2-2-th alignment electrode ALE2_2 and the third alignment electrode ALE3 may also be spaced apart from each other by a distance in the first direction DR1.

At the step of aligning the light emitting elements LD, the 2-1-th and 2-2-th alignment electrodes ALE2-1 and ALE2-2 may receive an identical signal.

The foregoing alignment signals may be signals having a voltage difference and/or a phase difference to align the light emitting elements LD between the alignment electrodes ALE. At least one of the alignment signals may be an AC signal (or voltage), but the disclosure is not limited thereto.

The first alignment electrode ALE1 may be electrically connected to each of the first pixel electrode PE1 and one or more components of the pixel circuit PXC. In detail, the first alignment electrode ALE1 may be electrically connected to the one or more components of the pixel circuit PXC through the first contactor CNT1 and electrically connected to the first pixel electrode PE1 through the first contact hole CH1.

The second alignment electrode ALE2 may be electrically connected to each of the third line component LP3 and the second pixel electrode PE2. In detail, the second alignment electrode ALE2 may be electrically connected to the third line component LP3 through the second contactor CNT2 and electrically connected to the second pixel electrode PE2 through the second contact hole CH2.

A bank pattern (not illustrated) may be disposed under the alignment electrode ALE so as to change a surface profile (or shape) of the alignment electrode ALE so that light emitted from the light emitting elements LD may be guided in an image display direction of the display device. The bank pattern may be a support component for supporting the alignment electrode ALE. Description of the bank pattern will be made with reference to FIG. 9.

Although at least two to several tens of light emitting elements LD may be aligned and/or provided in the emission area EMA (or the pixel area PXA), the number of light emitting elements LD is not limited thereto. In an embodiment, the number of light emitting elements LD aligned and/or provided in the emission area EMA (or the pixel area PXA) may be changed in various ways.

The light emitting elements LD may include a first light emitting element LD1, a second light emitting element LD2, a third light emitting element LD3, and a fourth light emitting element LD4.

The first light emitting element LD1 may be aligned between the first alignment electrode ALE1 and the 2-1-th alignment electrode ALE2_1 and electrically connected between the first pixel electrode PE1 and the first intermediate electrode CTE1. The second light emitting element LD2 may be aligned between the first alignment electrode ALE1 and the 2-1-th alignment electrode ALE2_1 and electrically connected between the first intermediate electrode CTE1 and the second intermediate electrode CTE2. In a plan view, the first light emitting element LD1 may be aligned in a lower end of an area between the first alignment electrode ALE1 and the 2-1-th alignment electrode ALE2_1, and the second light emitting element LD2 may be aligned in an upper end of the area.

Multiple first light emitting elements LD1 and multiple second light emitting elements LD2 may be provided. The first end EP1 of each of the first light emitting elements LD1 may be electrically connected to the first pixel electrode PE1. The second end EP2 of each of the first light emitting elements LD1 may be electrically connected to the first intermediate electrode CTE1. The first end EP1 of each of the second light emitting elements LD2 may be electrically connected to the first intermediate electrode CTE1. The second end EP2 of each of the second light emitting elements LD2 may be electrically connected to the second intermediate electrode CTE2.

The third light emitting element LD3 may be aligned between the 2-2-th alignment electrode ALE2_2 and the third alignment electrode ALE3 and electrically connected between the second intermediate electrode CTE2 and the third intermediate electrode CTE3. The fourth light emitting element LD4 may be aligned between the 2-2-th alignment electrode ALE2_2 and the third alignment electrode ALE3 and electrically connected between the third intermediate electrode CTE3 and the second pixel electrode PE2. In a plan view, the third light emitting element LD3 may be aligned in an upper end of an area between the 2-2-th alignment electrode ALE2_2 and the third alignment electrode ALE3, and the fourth light emitting element LD4 may be aligned in a lower end of the area.

In an embodiment, multiple third light emitting elements LD3 and multiple fourth light emitting elements LD4 may be provided. The first end EP1 of each of the third light emitting elements LD3 may be electrically connected to the second intermediate electrode CTE2. The second end EP2 of each of the third light emitting elements LD3 may be electrically connected to the third intermediate electrode CTE3. The first end EP1 of each of the fourth light emitting elements LD4 may be electrically connected to the third intermediate electrode CTE3. The second end EP2 of each of the fourth light emitting elements LD4 may be electrically connected to the second pixel electrode PE2.

The first light emitting elements LD1 may be electrically connected in parallel with each other between the first pixel electrode PE1 and the first intermediate electrode CTE1, and form the first serial set SET1. The second light emitting elements LD2 may be electrically connected in parallel with each other between the first intermediate electrode CTE1 and the second intermediate electrode CTE2, and form the second serial set SET2. The third light emitting elements LD3 may be electrically connected in parallel with each other between the second intermediate electrode CTE2 and the third intermediate electrode CTE3, and form the third serial set SET3. The fourth light emitting elements LD4 may be electrically connected in parallel with each other between the third intermediate electrode CTE3 and the second pixel electrode PE2, and form the fourth serial set SET4.

In an embodiment, the first light emitting elements LD1, the second light emitting elements LD2, the third light emitting elements LD3, and the fourth light emitting elements LD4 each may be a light emitting diode which is made of material having an inorganic crystal structure and has a subminiature size, e.g., ranging from the nanoscale to the microscale. For example, the first light emitting elements LD1, the second light emitting elements LD2, the third light emitting elements LD3, and the fourth light emitting elements LD4 each may be the light emitting element LD described with reference to FIGS. 1 and 2.

The pixel electrodes PE and the intermediate electrodes CTE may be provided in at least the emission area EMA, and each may be provided at a position corresponding to at least one alignment electrode ALE and at least one light emitting element LD. For example, each pixel electrode PE and each intermediate electrode CTE may be formed on the corresponding alignment electrodes ALE and the corresponding light emitting elements LD to overlap the alignment electrodes ALE and the light emitting elements LD, and thus electrically connected to at least the light emitting elements LD.

The first pixel electrode PE1 may be formed on an area (e.g., a lower area) of the first alignment electrode ALE1 and the respective first ends EP1 of the first light emitting elements LD1, and thus electrically connected to the respective first ends EP1 of the first light emitting elements LD1.

The second pixel electrode PE2 may be formed on an area (e.g., a lower area) of the 2-2-th alignment electrode ALE2_2 and the respective second ends EP2 of the fourth light emitting elements LD4, and thus electrically connected to the respective second ends EP2 of the fourth light emitting elements LD4. Furthermore, the second pixel electrode PE2 may be electrically connected to the first, second, and third light emitting elements LD1, LD2, and LD3 via at least one intermediate electrode CTE and/or the light emitting elements LD. For example, the second pixel electrode PE2 may be electrically connected to the second end EP2 of each first light emitting element LD1 via the first intermediate electrode CTE1, the second light emitting element LD2, the second intermediate electrode CTE2, the third light emitting element LD3, the third intermediate electrode CTE3, and the fourth light emitting element LD4.

The first intermediate electrode CTE1 may be formed on an area (e.g., a lower area) of the 2-1-th alignment electrode ALE2_1 and the respective second ends EP2 of the first light emitting elements LD1, and thus electrically connected to the second end EP2 of each first light emitting element LD1. Furthermore, the first intermediate electrode CTE1 may be formed on another area (e.g., an upper area) of the first alignment electrode ALE1 and the respective first ends EP1 of the second light emitting elements LD2, and thus electrically connected to the first end EP1 of each second light emitting element LD2. The first intermediate electrode CTE1 may be a first bridge electrode that connects the first serial set SET1 (or the first light emitting elements LD1) and the second serial set SET2 (or the second light emitting elements LD2).

The first intermediate electrode CTE1 may be bent at least one time. The first intermediate electrode CTE1 may be electrically connected to the first pixel electrode PE1 by at least one first light emitting element LD1, and electrically connected to the second pixel electrode PE2 by at least one second, third, and/or fourth light emitting element LD2, LD3, and/or LD4.

The second intermediate electrode CTE2 may be formed on another area (e.g., an upper area) of the 2-1-th alignment electrode ALE2_1 and the respective second ends EP2 of the second light emitting elements LD2, and thus electrically connected to the second end EP2 of each second light emitting element LD2. Furthermore, the second intermediate electrode CTE2 may be formed on an area (e.g., an upper area) of the third alignment electrode ALE3 and the respective first ends EP1 of the third light emitting elements LD3, and thus electrically connected to the first end EP1 of each third light emitting element LD3. For example, the second intermediate electrode CTE2 may be electrically connected, in the emission area EMA, to the respective second ends EP2 of the second light emitting elements LD2 and the respective first ends EP1 of the third light emitting elements LD3. The second intermediate electrode CTE2 may be a second bridge electrode that connects the second serial set SET2 (or the second light emitting elements LD2) and the third serial set SET3 (or the third light emitting elements LD3).

The second intermediate electrode CTE2 may be bent at least one time. The second intermediate electrode CTE2 may be electrically connected to the first pixel electrode PE1 by at least one first and/or second light emitting element LD1 and/or LD2, and electrically connected to the second pixel electrode PE2 by at least one third and/or fourth light emitting element LD3 and/or LD4.

The third intermediate electrode CTE3 may be formed on another area (e.g., an upper area) of the 2-2-th alignment electrode ALE2_2 and the respective second ends EP2 of the third light emitting elements LD3, and thus electrically connected to the second end EP2 of each third light emitting element LD3. Furthermore, the third intermediate electrode CTE3 may be formed on another area (e.g., a lower area) of the third alignment electrode ALE3 and the respective first ends EP1 of the fourth light emitting elements LD4, and thus electrically connected to the first end EP1 of each fourth light emitting element LD4. For example, the third intermediate electrode CTE3 may be electrically connected, in the emission area EMA, to the respective second ends EP2 of the third light emitting elements LD3 and the respective first ends EP1 of the fourth light emitting elements LD4. The third intermediate electrode CTE3 may be a third bridge electrode that connects the third serial set SET3 (or the third light emitting elements LD3) and the fourth serial set SET4 (or the fourth light emitting elements LD4).

The third intermediate electrode CTE3 may be bent at least one time. The third intermediate electrode CTE3 may be electrically connected to the first pixel electrode PE1 by at least one first, second, and/or third light emitting element LD1, LD2 and/or LD3, and electrically connected to the second pixel electrode PE2 by at least one fourth light emitting element LD4.

The first light emitting element LD1 may be electrically connected in series to the second light emitting element LD2 by the first intermediate electrode CTE1. The second light emitting element LD2 may be electrically connected in series to the third light emitting element LD3 by the second intermediate electrode CTE2. The third light emitting element LD3 may be electrically connected in series to the fourth light emitting element LD4 by the third intermediate electrode CTE3.

In the pixel PXL during each frame period, driving current may flow from the first pixel electrode PE1 to the second pixel electrode PE2 via the first light emitting element LD1, the first intermediate electrode CTE1, the second light emitting element LD2, the second intermediate electrode CTE2, the third light emitting element LD3, the third intermediate electrode CTE3, and the fourth light emitting element LD4.

The first light emitting element LD1, the second light emitting element LD2, the third light emitting element LD3, and the fourth light emitting element LD4 may be electrically connected in series between first pixel electrode PE1 and the second pixel electrode PE2 by the first intermediate electrode CTE1, the second intermediate electrode CTE2, and the third intermediate electrode CTE3. In this way, the light emitting elements LD aligned in the emission area EMA may be electrically connected in a serial/parallel combination structure to form the emission unit EMU of the pixel PXL. Hence, it may be possible to minimize a surface area occupied by the alignment electrode ALE (or prevent the number of alignment electrodes ALE from increasing) and also form the emission unit EMU having a serial/parallel combination structure including four serial sets SET1, SET2, SET3, and SET4, so that a high resolution and high definition display device may be implemented.

In an embodiment, the third conductive pattern CP3 may have an expanded shape sufficient to cover components disposed thereunder, e.g., the first line component LP1 and the second line component LP2. The third conductive pattern CP3 may be used as a shielding component that blocks an electric field induced from the first and second line components LP1 and LP2.

Since the third conductive pattern CP3 may be electrically connected to the first alignment electrode ALE1 through the third contactor CNT3, an alignment signal applied to the first alignment electrode ALE1 during the process of aligning the light emitting elements in the emission area EMA may be applied to the third conductive pattern CP3. Here, an identical alignment signal may be applied to the third conductive pattern CP3 and the first alignment electrode ALE1. As such, since the third conductive pattern CP3 to which a signal is applied may be interposed between the first alignment electrode ALE1 and the first and second line components LP1 and LP2 and has an expanded shape sufficient to cover the first and second line components LP1 and LP2, parasitic capacitance may be prevented from occurring between the first alignment electrode ALE1 and the first and second line components LP1 and LP2.

In case that the light emitting elements LD are aligned by forming respective electric fields between the first and 2-1-th alignment electrodes ALE1 and ALE2_1 and between the 2-2-th and third alignment electrodes ALE2_2 and ALE3 by applying corresponding alignment signals to the first, 2-1-th, 2-2-th, and third alignment electrodes ALE1, ALE2_1, ALE2_2, and ALE3, the third conductive pattern CP3 may prevent an electric field from being induced from the first and second line components LP1 and LP2, so that the light emitting elements LD may be more reliably aligned without being removed from a target area. Hence, misalignment of light emitting elements LD may be reduced, so that the valid light sources of the pixel PXL may be more reliably secured, whereby the light output efficiency may be improved.

As described above, in case that the third conductive pattern CP3 is used as a shielding component, an electric field induced from the first and second line components LP1 and LP2 may be mitigated or minimized from affecting alignment and/or operation of the light emitting elements LD. Therefore, misalignment and/or malfunction of the light emitting elements LD may be prevented, so that the reliability of the display device may be enhanced.

Hereinafter, the stacked structure of the pixel PXL in accordance with the foregoing embodiment will be described with reference to FIGS. 8 to 11.

Figure 8:
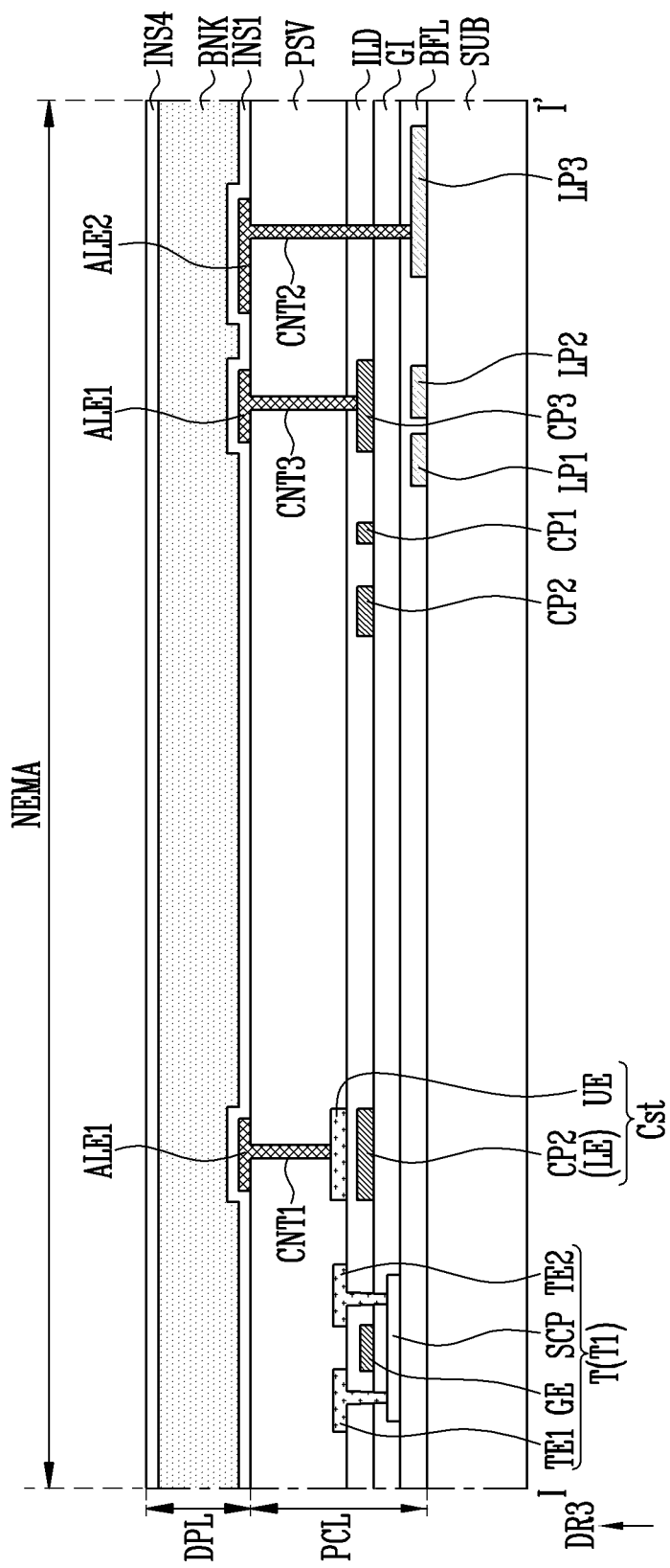
FIG. 8 is a schematic cross-sectional view taken along line I-I' of FIG. 6.
Figure 9:
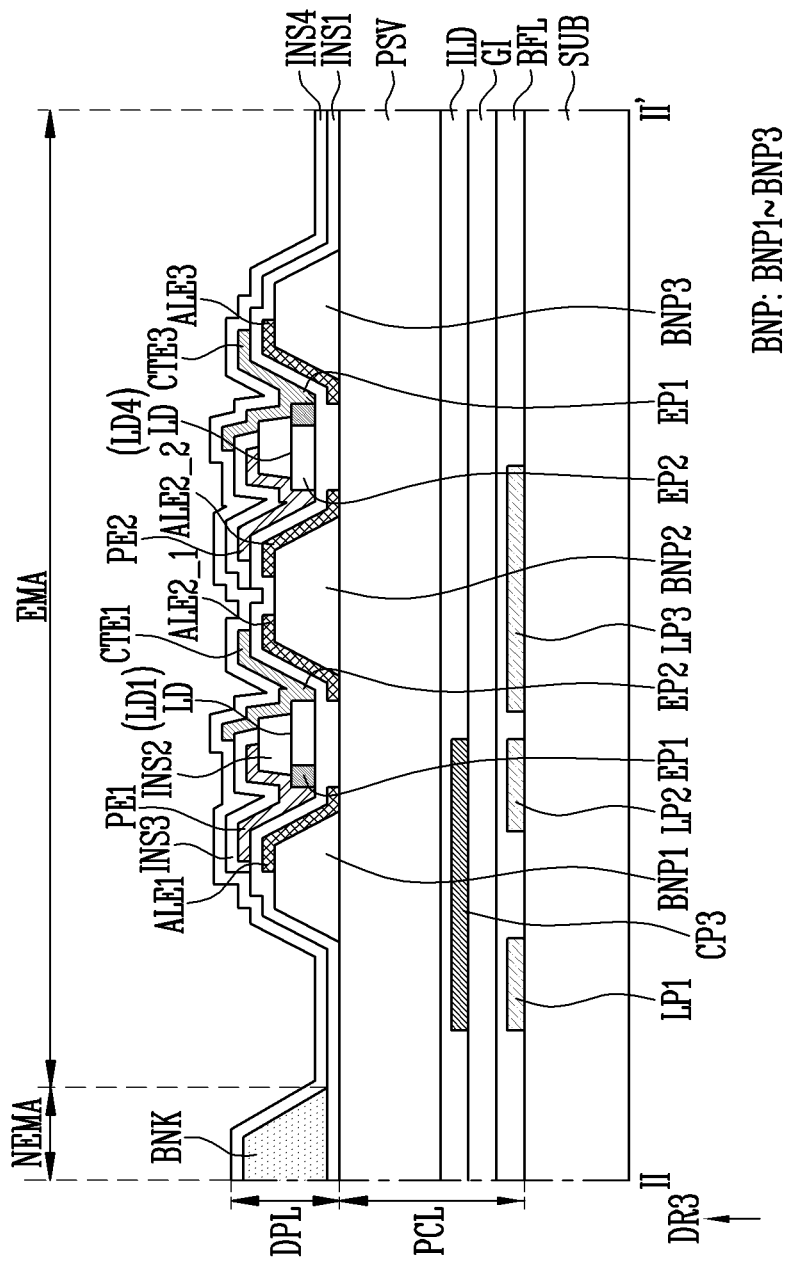
FIGS. 9 and 10 are schematic cross-sectional views taken along line II-II' of FIG. 6.
Figure 10:
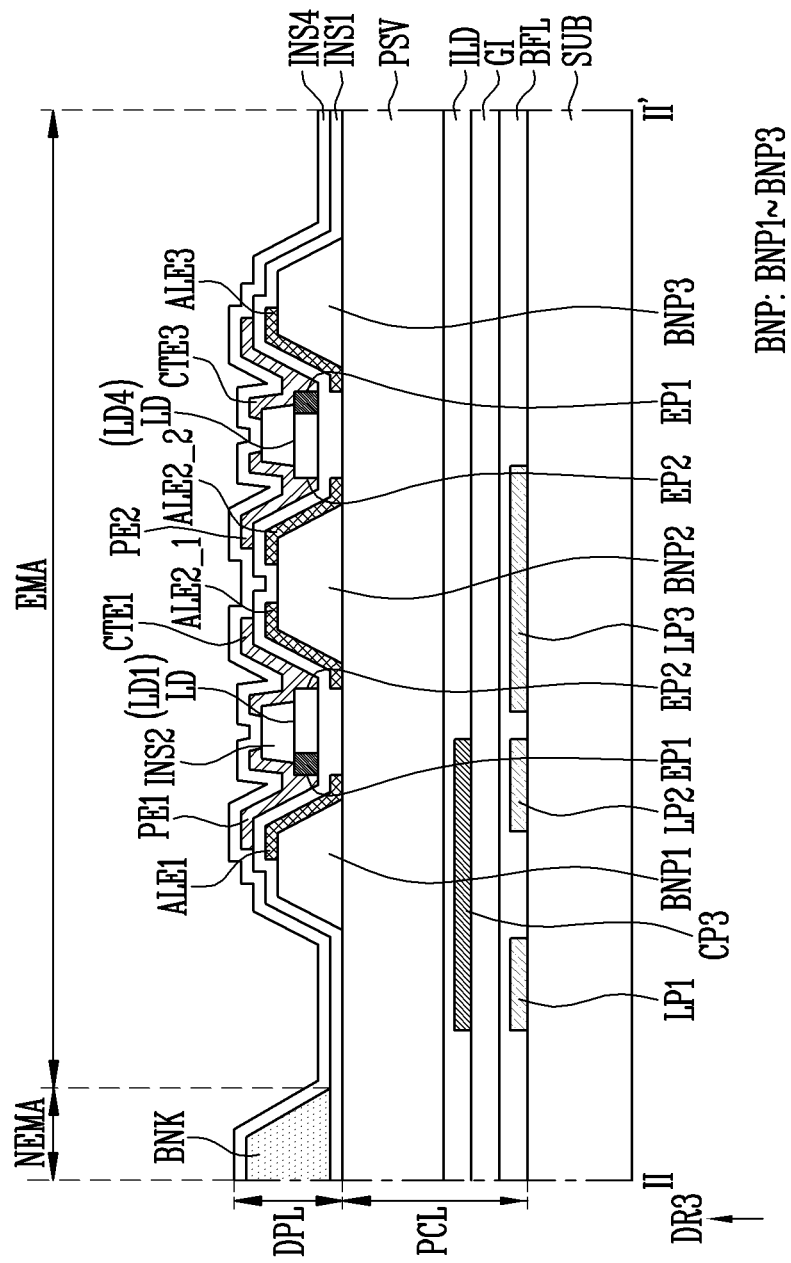
Figure 11:
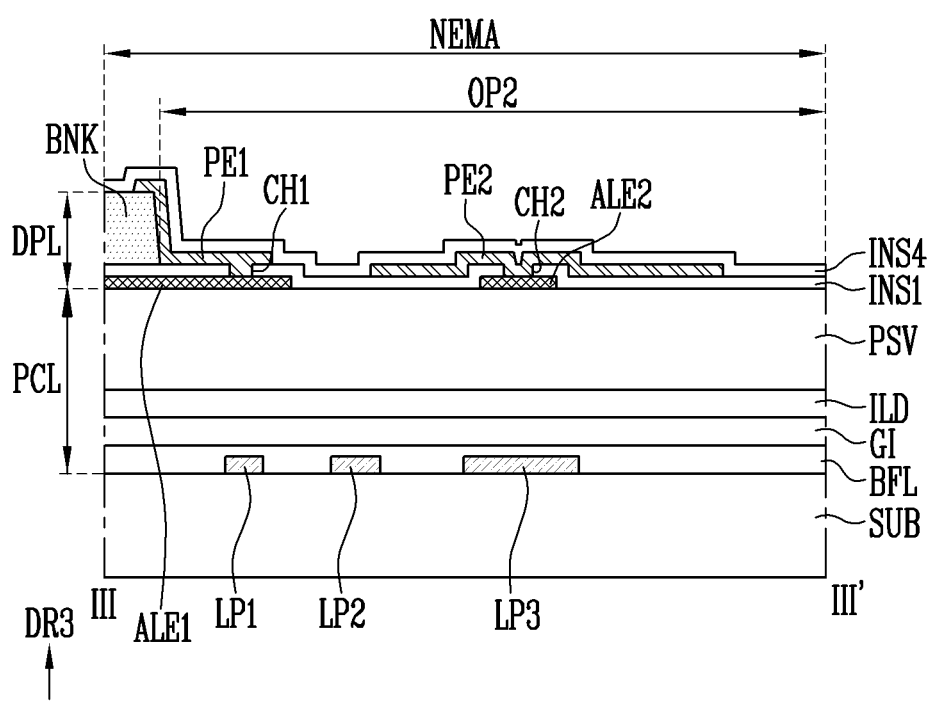
FIG. 11 is a schematic cross-sectional view taken along line III-III' of FIG. 6.

FIG. 8 is a schematic cross-sectional view taken along line I-I' of FIG. 6. FIGS. 9 and 10 are schematic cross-sectional views taken along line II-II' of FIG. 6. FIG. 11 is a schematic cross-sectional view taken along line III-III' of FIG. 6.

In the description of embodiments, "components may be provided and/or formed on the same layer" may mean that the components may be formed through the same process, and "components may be provided and/or formed on different layers may mean that the components may be formed through different processes.

Embodiments of FIGS. 9 and 10 refer to different embodiments pertaining both to the step of forming the pixel electrode PE and the intermediate electrode CTE and to whether the third insulating layer INS3 is present. For example, FIG. 9 illustrates an embodiment where one or more components CTE1 and CTE2 of the intermediate electrode CTE are formed after pixel electrodes PE and a third insulating layer INS3 have been formed. FIG. 10 illustrates an embodiment where the pixel electrodes PE and the intermediate electrodes CTE are formed on the same layer.

In FIGS. 9 to 11, a height direction (or a vertical direction) in a cross-sectional view is represented by a third direction DR3.

The pixel PXL may include a substrate SUB, a pixel circuit layer PCL, and a display element layer DPL. The pixel circuit layer PCL and the display element layer DPL may be disposed on a surface of the substrate SUB and overlap each other. For example, the display area DA of the substrate SUB may include the pixel circuit layer PCL disposed on the surface of the substrate SUB, and the display element layer DPL disposed on the pixel circuit layer PCL. However, relative positions of the pixel circuit layer PCL and the display element layer DPL on the substrate SUB may be changed depending on embodiments. In case that the pixel circuit layer PCL and the display element layer DPL are separated from each other as separate layers and overlap each other, layout space sufficient to form each of the pixel circuit PXC and the emission unit EMU may be secured.

The substrate SUB may include a transparent insulating material to allow light transmission. The substrate SUB may be a rigid substrate or a flexible substrate.

For example, the rigid substrate SUB may be at least one of an organic substrate, a quartz substrate, a glass ceramic substrate, and a crystalline glass substrate.

The flexible substrate SUB may be either a film substrate or a plastic substrate which includes polymer organic material. For example, the flexible substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

Multiple insulating layers and multiple conductive layers may be disposed on the substrate SUB. For example, the insulating layers may include a buffer layer BFL, a gate insulating layer GI, an interlayer insulating layer ILD, a passivation layer PSV, and first to fourth insulating layers INS1, INS2, INS3, and INS4, which may be successively disposed on the substrate SUB. The conductive layers may be provided and/or formed between the insulating layers. For example, the conductive layers may include a first conductive layer disposed on the substrate SUB, a second conductive layer disposed on the gate insulating layer GI, a third conductive layer disposed on the interlayer insulating layer ILD, a fourth conductive layer disposed on the passivation layer PSV, and a fifth conductive layer disposed on the second insulating layer INS2. However, the insulating layers and the conductive layers disposed on the substrate SUB are not limited to those of the foregoing embodiment. In some embodiments, other insulating layers and other conductive layers may be disposed on the substrate SUB.

In each pixel area PXA of the pixel circuit layer PCL, circuit elements (e.g., transistors T, a storage capacitor Cst, and a conductive pattern CP) for forming the pixel circuit PXC of the corresponding pixel PXL, and signal line components (e.g., the first to fourth line components LP1, LP2, LP3, and LP4) electrically connected to the circuit elements may be disposed. Furthermore, in each pixel area PXA of the display circuit layer DPL, the alignment electrodes ALE, the light emitting elements LD, and/or the pixel electrodes PE that form the emission unit EMU of the corresponding pixel PXL may be disposed.

The first, second, third, and fourth line components LP1, LP2, LP3, and LP4 may be provided and/or formed on the substrate SUB. A voltage of the initialization power supply may be applied to the first line component LP1. A data voltage may be applied to the second line component LP2. A voltage of the second driving power supply may be applied to the third line component LP3. A voltage of the first driving power supply may be applied to the fourth line component LP4.

The first, second, third, and fourth line components LP1, LP2, LP3, and LP4 each may include conductive material (or substance). For example, each of the first, second, third, and fourth line components LP1, LP2, LP3, and LP4 may have a single-layer structure formed of one or more selected from the group of copper (Cu), molybdenum (Mo), tungsten (W), aluminum neodymium (AlNd), titanium (Ti), aluminum (Al), silver (Ag), and an alloy thereof, or may have a double-layer or multi-layer structure formed of molybdenum (Mo), titanium (Ti), copper (Cu), aluminum (Al), or silver (Ag) to reduce line resistance.

The first, second, third, and fourth line components LP1, LP2, LP3, and LP4 each may be a first conductive layer disposed between the substrate SUB and the buffer layer BFL.

The buffer layer BFL may be provided and/or formed on overall surfaces of the first, second, third, and fourth line components LP1, LP2, LP3, and LP4 and the substrate SUB.

The buffer layer BFL may prevent impurities from diffusing into a transistor T included in the pixel circuit PXC. The buffer layer BFL may be an inorganic insulating layer formed of an inorganic material. The buffer layer BFL may include at least one of silicon nitride $SiN_x$, silicon oxide $SiO_x$, silicon oxynitride $SiO_xN_y$, and metal oxide such as aluminum oxide $AlO_x$. The buffer layer BFL may be provided in a single-layer structure or a multi-layer structure having at least two or more layers. In case that the buffer layer BFL has a multi-layer structure, the respective layers may be formed of the same material or different materials. The buffer layer BFL may be omitted depending on the material of the substrate SUB or processing conditions. In an embodiment, the buffer layer BFL may be partially open to include a second contactor CNT2 which exposes a portion of the third line component LP3 in at least the non-emission area NEMA.

At least one transistor T may be provided and/or formed on the buffer layer BFL. The transistor T may be the first transistor T1 described with reference to FIGS. 4 and 5.

The transistor T may include a semiconductor pattern SCP and a gate electrode GE.

The semiconductor pattern SCP may be provided and/or formed on the buffer layer BFL. The semiconductor pattern SCP may include a channel area which overlaps the gate electrode GE, a first contact area which may be electrically connected to an end of the channel area and may not overlap the gate electrode GE, and a second contact area which may be electrically connected to another end of the channel area and may not overlap the gate electrode GE. The semiconductor pattern SCP may be a semiconductor pattern formed of polysilicon, amorphous silicon, an oxide semiconductor, etc., or a combination thereof. For example, the channel area may be a semiconductor pattern undoped with impurities and be an intrinsic semiconductor. Each of the first contact area and the second contact area may be a semiconductor pattern doped with impurities.

A gate insulating layer GI may be provided and/or formed on overall surfaces of the semiconductor pattern SCP and the buffer layer BFL.

The gate insulating layer GI may be an inorganic insulating layer including an inorganic material. In an embodiment, the gate insulating layer GI may be formed of an organic insulating layer including an organic material. Although the gate insulating layer GI may be provided in a single-layer structure, the gate insulating layer GI may be provided in a multi-layer structure having at least two or more layers. In an embodiment, the gate insulating layer GI may include a second contactor CNT2 corresponding to the second contactor CNT2 of the buffer layer BFL and be partially open to expose the third line component LP3. Furthermore, the gate insulating layer GI may be partially open to expose a portion of each of the first and second contact areas of the semiconductor pattern SCP.

The gate electrode GE and the conductive pattern CP may be provided and/or formed on the gate insulating layer GI. The gate electrode GE and the conductive pattern CP may correspond to the second conductive layer provided and/or formed on the gate insulating layer GI.

The gate electrode GE may be provided and/or formed on the gate insulating layer GI to correspond to the channel area of the semiconductor pattern SCP.

The gate electrode GE may be disposed on the gate insulating layer GI and overlap the channel area of the semiconductor pattern SCP. The gate electrode GE may have a single-layer structure formed of one or more selected from the group of copper (Cu), molybdenum (Mo), tungsten (W), aluminum neodymium (AlNd), titanium (Ti), aluminum (Al), silver (Ag), and an alloy thereof, or may have a double-layer or multi-layer structure formed of molybdenum (Mo), titanium (Ti), copper (Cu), aluminum (Al), or silver (Ag) to reduce line resistance.

The gate electrode GE may be integrally provided with the conductive pattern CP. For example, the gate electrode GE of the first transistor T1 may be integrally provided with the second conductive pattern CP2. The gate electrode GE of the second transistor T2 may be integrally provided with the first conductive pattern CP1. The gate electrode GE of the third transistor T3 may be integrally provided with the fourth conductive pattern CP4.

The second conductive pattern CP2 may be the first storage electrode LE (hereinafter, referred to as "lower electrode") of the storage capacitor Cst.

The third conductive pattern CP3 may be provided and/or formed on the gate insulating layer GI and spaced apart from the first, second, and fourth conductive patterns CP1, CP2, and CP4.

The third conductive pattern CP3 may be disposed on a surface of the gate insulating layer GI to correspond to the first and second line components LP1 and LP2. The third conductive pattern CP3 may be disposed on the first and second line components LP1 and LP2, and overlap the first and second line components LP1 and LP2.

In an embodiment, the third conductive pattern CP3 may be disposed on a surface of the gate insulating layer GI, overlap the first and second line components LP1 and LP2, and be provided in the form of a bar expanding to be adjacent to the non-emission area NEMA so that the first and second line components LP1 and LP2 may be sufficiently covered with the third conductive pattern CP3. As described above, in case that the third conductive pattern CP3 expands and sufficiently covers the first and second line components LP1 and LP2 disposed thereunder, the third conductive pattern CP3 may be used as a shielding component for blocking an electric field induced from the first and second line components LP1 and LP2.

An interlayer insulating layer ILD may be provided and/or formed on the gate electrode GE and the conductive pattern CP.

The interlayer insulating layer ILD may include a material equal or similar to that of the gate insulating layer GI, or may include one or more materials selected from among materials such as the material for forming the gate insulating layer GI. The interlayer insulating layer ILD may be partially open to include both a second contactor CNT2 corresponding to the second contactor CNT2 of the gate insulating layer GI, and a third contactor CNT3 which exposes an area of the third conductive pattern CP3. Furthermore, the interlayer insulating layer ILD may be partially open to expose a portion of each of the first and second contact areas of the semiconductor pattern SCP.

First and second connectors TE1 and TE2 and a second storage electrode UE (hereinafter, referred to as "upper electrode") of the storage capacitor Cst may be provided and/or formed on the interlayer insulating layer ILD.

The first and second connectors TE1 and TE2 and the upper electrode UE may correspond to the third conductive layer disposed on the interlayer insulating layer ILD.

The first and second connectors TE1 and TE2 may respectively contact the first contact area and the second contact area of the semiconductor pattern SCP that may be exposed. For example, the first connector TE1 may contact the first contact area of the semiconductor pattern SCP of the first transistor T1, and the second connector TE2 may contact the second contact area of the semiconductor pattern SCP. The first connector TE1 may be a connection component that electrically connects the first contact area of the first transistor T1 to the fourth line component LP4. The second connector TE2 may be a connection component that electrically connects the second contact area of the first transistor T1 to the light emitting elements LD.

Each of the first and second connectors TE1 and TE2 may include a material equal or similar to that of the gate electrode GE, or include one or more materials selected from among materials such as the material for forming the gate electrode GE.

The upper electrode UE may be disposed on the interlayer insulating layer ILD on the lower electrode LE formed integrally with the second conductive pattern CP2, and overlap the lower electrode LE. The capacity of the storage capacitor Cst may be increased by increasing an overlapping area between the upper electrode UE and the lower electrode LE. Although not directly illustrated, the upper electrode UE may be electrically connected to the first transistor T1.

The passivation layer PSV may be provided and/or formed on the overall surfaces of the first and second connectors TE1 and TE2, the upper electrode UE, and the interlayer insulating layer ILD.

The passivation layer PSV (referred also to as "protective layer" or "via layer") may be an inorganic layer (an inorganic insulating layer) including an inorganic material, or an organic layer (or an organic insulating layer) including an organic material. The inorganic insulating layer may include, for example, at least one of silicon oxide ($SiO_x$), silicon nitride ($SiN_x$), silicon oxynitride ($SiO_xN_y$), and metal oxide such as aluminum oxide ($AlO_x$). The organic insulating layer may include, for example, at least one of poly-acrylates resin, epoxy resin, phenolic resin, polyamides resin, polyimides rein, unsaturated polyesters resin, poly-phenylen ethers resin, poly-phenylene sulfides resin, and benzocyclobutene resin.

The passivation layer PSV may be partially open to include a first contactor CNT1 that exposes a portion of the upper electrode UE, a second contactor CNT2 corresponding to the interlayer insulating layer ILD, and a third contactor CNT3 corresponding to the third contactor CNT3 of the interlayer insulating layer ILD.

The display element layer DPL may be provided and/or formed on the passivation layer PSV.

The display element layer DPL may include bank patterns BNP, alignment electrodes ALE, a bank BNK, light emitting elements LD, pixel electrodes PE, and intermediate electrodes CTE. Furthermore, the display element layer DPL may include at least one or more insulating layers disposed between the foregoing components. For example, the display element layer DPL may include a first insulating layer INS1, a second insulating layer INS2, a third insulating layer INS3, and a fourth insulating layer INS4. In an embodiment, the third insulating layer INS3 may be selectively provided.

The bank patterns BNP may be provided and/or formed on the passivation layer PSV.

The bank patterns BNP (referred also to as "wall pattern", "protrusion pattern", "support pattern", or "pattern") may be disposed on a surface of the passivation layer PSV. For example, the bank patterns BNP may protrude in the third direction DR3 on the surface of the passivation layer PSV. Hence, an area of each of the alignment electrodes ALE disposed on the bank patterns BNP may protrude in the third direction DR3 (or the thickness-wise direction of the substrate SUB).

The bank patterns BNP each may be an inorganic insulating layer including an inorganic material or an organic insulating layer including an organic material. In an embodiment, the bank patterns BNP each may include an organic insulating layer having a single layer structure and/or an inorganic insulating layer having a single layer structure, but the disclosure is not limited thereto. In an embodiment, the bank patterns BNP may be provided in a multi-layer structure formed by stacking at least one organic insulating layer and at least one inorganic insulating layer. However, the material of the bank patterns BNP is not limited to the foregoing embodiment. In an embodiment, the bank patterns BNP may include conductive material (or conductive substance).

The bank patterns BNP may include first, second, and third bank patterns BNP1, BNP2, and BNP3 disposed in at least the emission area EMA.

Each of the first and third bank patterns BNP1 and BNP3 may partially overlap at least one alignment electrode ALE in at least the emission area EMA. For example, the first bank pattern BNP1 may be disposed under the first alignment electrode ALE1 to overlap an area of the first alignment electrode ALE1. The third bank pattern BNP3 may be disposed under the third alignment electrode ALE3 to overlap an area of the third alignment electrode ALE3.

The second bank pattern BNP2 may overlap the second alignment electrode ALE2 in at least the emission area EMA. For example, the second bank pattern BNP2 may be provided under the 2-1-th alignment electrode ALE2_1 and the 2-2-th alignment electrode ALE2_2 and overlap the 2-1-th and 2-2-th alignment electrodes ALE2_1 and ALE2_2.

Since the bank patterns BNP may be provided under an area of each of the alignment electrodes ALE, the area of each of the alignment electrodes ALE may protrude in an upward direction of the pixel PXL in the areas where the bank patterns BNP may be formed. Consequently, a wall structure may be formed around the light emitting elements LD. For example, the wall structure may be formed in the emission area EMA and face the first and second ends EP1 and EP2 of the light emitting elements LD. Here, the wall structure may correspond to the bank patterns BNP.

In an embodiment, in case that the bank patterns BNP and/or the alignment electrodes ALE include reflective material, a reflective wall structure may be formed around the light emitting elements LD. Hence, light emitted from the light emitting elements LD may be oriented in an upward direction of the pixel PXL (e.g., in an image display direction of the display device), so that the light efficiency of the pixel PXL may be further improved.

The bank patterns BNP may have a trapezoidal cross-section which may be reduced in width from a surface (e.g., an upper surface) of the passivation layer PSV upward in the third direction DR3, but the disclosure is not limited thereto. In an embodiment, the bank patterns BNP may include a curved surface having a cross-sectional shape such as a semi-elliptical shape or a semi-circular shape (or a hemi-spherical shape) which may be reduced in width from a surface of the passivation layer PSV upward in the third direction DR3. In a sectional view, the shape of the bank patterns BNP is not limited to the foregoing examples, and may be changed in various ways within a range in which the efficiency of light emitted from each of the light emitting elements LD may be enhanced. Furthermore, in some embodiments, at least one of the bank patterns BNP may be omitted, or the position thereof may be changed.

In an embodiment, the bank patterns BNP each may be used as a reflector. For example, the bank patterns BNP, along with the alignment electrodes ALE disposed thereover, may be used as reflectors to guide light emitted from each light emitting element LD in a desired direction, so that the light output efficiency of the pixel PXL may be enhanced.

The alignment electrodes ALE may be provided and/or formed on the bank patterns BNP and the passivation layer PSV. The alignment electrodes ALE may correspond to the fourth conductive layer.

The first alignment electrode ALE1 may be provided and/or formed on the passivation layer PSV and the first bank pattern BNP1. The 2-1-th alignment electrode ALE2_1 may be provided and/or formed on the passivation layer PSV and the second bank pattern BNP2. The 2-2-th alignment electrode ALE2_2 may be provided and/or formed on the passivation layer PSV and the second bank pattern BNP2. The third alignment electrode ALE3 may be provided and/or formed on the passivation layer PSV and the third bank pattern BNP3.

The first alignment electrode ALE1 may have a shape corresponding to an inclination of the first bank pattern BNP1 disposed thereunder. The 2-1-th alignment electrode ALE2_1 may have a shape corresponding to an inclination of the second bank pattern BNP2 disposed thereunder. The 2-2-th alignment electrode ALE2_2 may have a shape corresponding to an inclination of the second bank pattern BNP2 disposed thereunder. The third alignment electrode ALE3 may have a shape corresponding to an inclination of the third bank pattern BNP3 disposed thereunder.

The alignment electrodes ALE may be disposed on the same plane and have the same thickness with respect to the third direction DR3. Furthermore, the alignment electrodes ALE may be simultaneously formed through the same process.

The alignment electrodes ALE may be formed of material having a determined (or uniform) reflectivity to allow light emitted from the light emitting elements LD to travel in the image display direction of the display device. For example, the alignment electrodes ALE may be formed of conductive material. The conductive material (or substance) may include opaque metal that has an advantage in reflecting, in the image display direction of the display device, light emitted from the light emitting elements LD.

Each of the alignment electrodes ALE may be provided and/or formed to have a single-layer structure, but the disclosure is not limited thereto. In an embodiment, each of the alignment electrodes ALE may be provided and/or formed in a multi-layer structure formed by stacking at least two materials among metals, alloys, conductive oxides, and conductive polymers. Each of the alignment electrodes ALE may be formed of a multi-layer structure including at least two layers to minimize distortion resulting from a signal delay in case that signals (or voltages) are transmitted to the opposite ends EP1 and EP2 of the respective light emitting elements LD.

As described above, in case that the alignment electrodes ALE are formed of conductive material having a constant reflectivity, light emitted from the opposite ends, e.g., the first and second ends EP1 and EP2, of each of the light emitting elements LD may more effectively travel in the image display direction (or the third direction DR3) of the display device. Particularly, if the alignment electrodes ALE have inclined or curved surfaces corresponding to the shape of the bank pattern BNP and are disposed to face the first and second ends EP1 and EP2 of the light emitting elements LD, light emitted from the first and second ends EP1 and EP2 of each of the light emitting elements LD may be reflected by the alignment electrodes ALE and thus more reliably travel in the image display direction of the display device. Consequently, the efficiency of light emitted from the light emitting elements LD may be enhanced.

The first alignment electrode ALE1 may contacts the upper electrode UE through the first contactor CNT1 passing through the passivation layer PSV, and be thus electrically connected to the upper electrode UE. Since the upper electrode UE is electrically connected to the first transistor T1, the first alignment electrode ALE1 may be electrically connected to the first transistor T1.

Furthermore, the first alignment electrode ALE1 may contact the third conductive pattern CP3 through the third contactor CNT3 successively passing through the passivation layer PSV and the interlayer insulating layer ILD, and be thus electrically connected to the third conductive pattern CP3.

The second alignment electrode ALE2 including the 2-1-th and 2-2-th alignment electrodes ALE2_1 and ALE2_2 may contact the third line component LP3 through the second contactor CNT2 successively passing through the passivation layer PSV, the interlayer insulating layer ILD, the gate insulating layer GI, and the buffer layer BFL, and be thus electrically connected to the third line component LP3.

The first insulating layer INS1 may be provided and/or formed on the alignment electrodes ALE.

The first insulating layer INS1 may be partially open in at least the non-emission area NEMA so that components disposed thereunder may be exposed. For example, the first insulating layer INS1 may be partially open to include a first contact hole CH1 which is formed by removing an area of the first insulating layer INS1 in at least the non-emission area NEMA (or in the second opening OP2 of the bank BNK) and exposes a portion of the first alignment electrode ALE1, and a second contact hole CH2 which is formed by removing another area of the first insulating layer INS1 in at least the non-emission area NEMA (or in the second opening OP2 of the bank BNK) and exposes a portion of the second alignment electrode ALE2.

The first insulating layer INS1 may be formed of an inorganic insulating layer including an inorganic material, or an organic insulating layer including an organic material. The first insulating layer INS1 may be formed of an inorganic insulating layer having an advantage in protecting the light emitting elements LD from the pixel circuit layer PCL.

The bank BNK may be provided and/or formed on the first insulating layer INS1.

The bank BNK may be formed, to enclose the emission area EMA of the pixel PXL, between adjacent pixels PXL so that a pixel defining layer for defining the emission area EMA of the corresponding pixel PXL may be formed. At the step of supplying the light emitting elements LD to the emission area EMA, the bank BNK may be a dam structure that prevents a solution mixed with the light emitting elements LD from being drawn into the emission area EMA of an adjacent pixel PXL or control the amount of solution such that a constant amount of solution is supplied to each emission area EMA.

The light emitting elements LD may be supplied to and aligned in the emission area EMA of the pixel PXL in which the first insulating layer INS1 may be formed. For example, the light emitting elements LD may be supplied (or input) to the emission area EMA through an inkjet printing scheme or the like. The light emitting elements LD may be aligned between the alignment electrodes ALE by an alignment signal (or an alignment voltage) applied to each of the alignment electrodes ALE. Here, an identical alignment signal may be applied to the first alignment electrode ALE1 and the third alignment electrode ALE3. For example, a ground voltage may be applied to the first alignment electrode ALE1 and the third alignment electrode ALE3. An identical alignment signal may be applied to the 2-1-th and 2-2-th alignment electrodes ALE2_1 and ALE2_2 of the second alignment electrode ALE2. For example, an AC signal may be applied to the 2-1-th alignment electrode ALE2_1 and the 2-2-th alignment electrode ALE2_2.

In the emission area EMA, the second insulating layer INS2 may be provided and/or formed on the light emitting elements LD. The second insulating layer INS2 may be provided and/or formed on the light emitting elements LD to partially cover the outer circumferential surface (or the surface) of each of the light emitting elements LD such that the first end EP1 and the second end EP2 of each of the light emitting elements LD may be exposed to the outside.

The second insulating layer INS2 may be formed of a single layer or multiple layers, and include an inorganic insulating layer including at least one inorganic material or an organic insulating layer including at least one organic material. The second insulating layer INS2 may include an inorganic insulating layer that has an advantage in protecting the active layer (refer to "12" of FIG. 1) of each of the light emitting elements LD from external oxygen, water, etc. However, the disclosure is not limited thereto. The second insulating layer INS2 may be formed of an organic insulating layer including an organic material, depending on design conditions, etc. of the display device to which the light emitting elements LD may be applied. Since the second insulating layer INS2 is formed on the light emitting elements LD after the alignment of the light emitting elements LD in the pixel area PXA (or the emission area EMA) of the pixel PXL has been completed, the light emitting elements LD may be prevented from being removed from the aligned positions.

In case that a gap (or space) is present between the first insulating layer INS1 and the light emitting elements LD before the formation of the second insulating layer INS2, the gap may be filled with the second insulating layer INS2 during a process of forming the second insulating layer INS2. The second insulating layer INS2 may be formed of an organic insulating layer that has an advantage in filling the gap between the first insulating layer INS1 and the light emitting elements LD with the second insulating layer INS2, but the disclosure is not limited thereto.

The third insulating layer INS3 may be disposed to cover at least one of the intermediate electrodes CTE and any of the pixel electrodes PE that are disposed on the first and second ends EP1 and EP2 of the light emitting elements LD. For example, the third insulating layer INS3 may be disposed on each of the first and second pixel electrodes PE1 and PE2 to cover the first and second pixel electrodes PE1 and PE2 in at least the emission area EMA, as illustrated in FIG. 9. The third insulating layer INS3 may be formed of an inorganic insulating layer including an inorganic material, or an organic insulating layer including an organic material.

If the second and/or third insulating layers INS2 and/or INS3 are formed over the light emitting elements LD, electrical stability between the first and second ends EP1 and EP2 of the light emitting elements LD may be further secured.

As illustrated in FIG. 10, in an embodiment where the pixel electrodes PE and the intermediate electrodes CTE may be disposed on the same layer, the third insulating layer INS3 may not be provided.

The pixel electrodes PE may be disposed, in at least the emission area EMA, on the light emitting elements LD, the second insulating layer INS2 disposed on the light emitting elements LD, and the first insulating layer INS1 disposed on the alignment electrode ALE. In an embodiment, the pixel electrodes PE may correspond to the fifth conductive layer provided and/or formed on the second insulating layer INS2.

In at least the emission area EMA, the first pixel electrode PE1 may be disposed on the first end EP1 of the first light emitting element LD1, the second insulating layer INS2 disposed on the first light emitting element LD1, and the first insulating layer INS1 disposed on the first alignment electrode ALE1. Furthermore, the first pixel electrode PE1 may be disposed on the first alignment electrode ALE1 exposed through the first contact hole CH1 in at least the non-emission area NEMA (or the second opening OP2 of the bank BNK). The first pixel electrode PE1 may directly contact the first alignment electrode ALE1 through the first contact hole CH1 and be electrically connected to the first alignment electrode ALE1.

In at least the emission area EMA, the second pixel electrode PE2 may be disposed on the second end EP2 of the fourth light emitting element LD4, the second insulating layer INS2 disposed on the fourth light emitting element LD4, and the first insulating layer INS1 disposed on the 2-2-th alignment electrode ALE2_2. Furthermore, the second pixel electrode PE2 may be disposed on the second alignment electrode ALE2 exposed through the second contact hole CH2 in at least the non-emission area NEMA (or the second opening OP2 of the bank BNK). The second pixel electrode PE2 may directly contact the second alignment electrode ALE2 through the second contact hole CH2 and be electrically connected to the second alignment electrode ALE2.

The first pixel electrode PE1 and the second pixel electrode PE2 may be formed through the same process and be disposed on a same layer. However, the disclosure is not limited thereto. In some embodiments, the first pixel electrode PE1 and the second pixel electrode PE2 may be formed through different processes and be provided on different layers.

The pixel electrodes PE may be formed of various transparent conductive materials. For example, the pixel electrodes PE may include at least one of various transparent conductive materials (or substances) including indium tin oxide (ITO), indium zinc oxide (IZO), zinc oxide ($ZnO_x$), indium gallium zinc oxide (IGZO), and indium tin zinc oxide (ITZO), and be substantially transparent or translucent to satisfy a transmittancy (or transmittance). However, the material of the pixel electrodes PE is not limited to the foregoing embodiment. The zinc oxide ($ZnO_x$) may be zinc oxide (ZnO) and/or zinc peroxide ($ZnO_2$).

At least one of the intermediate electrodes CTE may be formed through a process identical with that of the pixel electrodes PE and be formed on a layer identical with that of the pixel electrodes PE. Another of the intermediate electrodes CTE may be formed through a process different from that of the pixel electrodes PE and be formed on a layer different from that of the pixel electrodes PE. For example, the first and third intermediate electrodes CTE1 and CTE3 may be formed on the third insulating layer INS3 and be spaced apart from the pixel electrodes PE that may be covered with the third insulating layer INS3. Furthermore, the second intermediate electrode CTE2 may be formed through a process identical with that of the pixel electrodes PE and provided on a layer identical with that of the pixel electrodes PE. Here, the disclosure is not limited to the foregoing embodiment. In an embodiment, as illustrated in FIG. 10, all of the first, second, and third intermediate electrodes CTE1, CTE2, and CTE3 may be formed through a process identical with that of the pixel electrodes PE and provided on a layer identical with that of the pixel electrodes PE.

The intermediate electrodes CTE may be formed of various transparent conductive materials. The intermediate electrodes CTE may include the same material as that of the pixel electrodes PE, or may include one or more materials selected from among materials such as the material for forming the pixel electrodes PE.

The fourth insulating layer INS4 may be provided and/or formed on the intermediate electrodes CTE. The fourth insulating layer INS4 may be an inorganic insulating layer including an inorganic material or an organic insulating layer including an organic material. For example, the fourth insulating layer INS4 may have a structure formed by alternately stacking at least one inorganic insulating layer and at least one organic insulating layer. The fourth insulating layer INS4 may cover the entirety of the display element layer DPL and prevent water or moisture from being drawn into the display element layer DPL including the light emitting elements LD from the outside.

In an embodiment, at least one overcoat layer (e.g., a layer for planarizing the upper surface of the display element layer DPL) may be further disposed over the fourth insulating layer INS4. In an embodiment, an optical layer may be selectively disposed over the fourth insulating layer INS4. For example, a color conversion layer including color conversion particles for converting the color of light emitted from the light emitting elements LD to a specific color of light may be further provided over the fourth insulating layer INS4.

As described above, in at least the emission area EMA, the third conductive pattern CP3 having an expanded shape sufficient to cover the first and second line components LP1 and LP2 may be disposed on the gate insulating layer GI over the first and second line components LP1 and LP2. The third conductive pattern CP3 and the first alignment electrode ALE1 may be electrically connected to each other through the third contactor CNT3. An electric field induced by signals respectively applied to the first and second line components LP1 and LP2 in case that the light emitting elements LD are aligned may be blocked. Therefore, misalignment of the light emitting elements LD may be prevented from occurring, and the light emitting elements LD may be prevented from being removed from desired positions (or aligned positions, e.g., between the alignment electrodes ALE), so that the alignment of the light emitting elements LD may be improved. Hence, the number of valid light sources in the pixel PXL may be increased, and the light output efficiency may be enhanced, whereby the reliability of the display device may be further improved.

Figure 12:
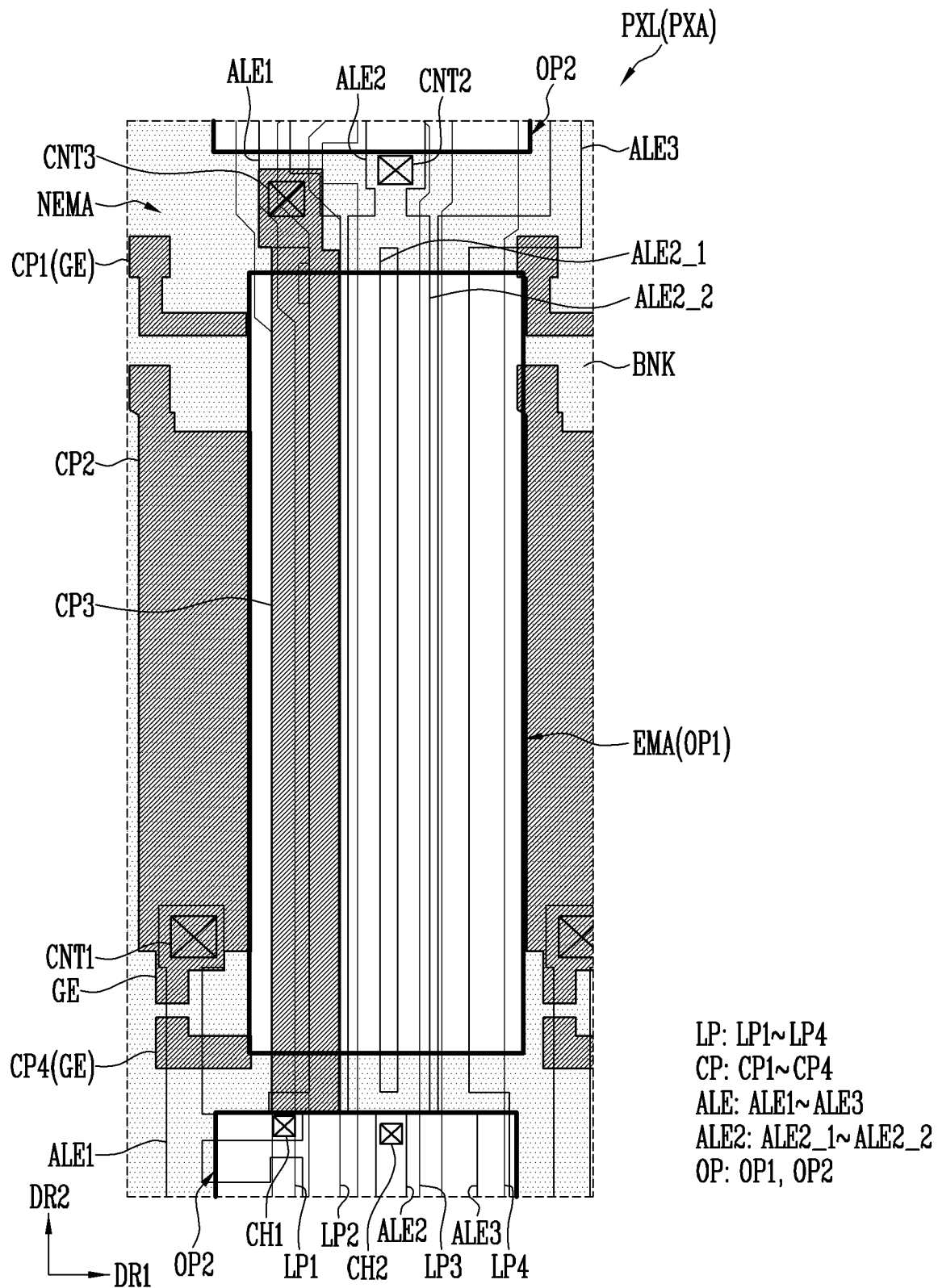
FIG. 12 is a plan diagram schematically illustrating the pixel before light emitting elements are aligned.

FIG. 12 is a plan diagram schematically illustrating the pixel PXL before light emitting elements LD are aligned With regard to the pixel of FIG. 12, the following description will be focused on differences from that of the foregoing embodiments, to avoid redundant explanation.

Referring to FIGS. 3 and 5 to 12, before the light emitting elements LD are aligned in the pixel PXL, the alignment electrodes ALE may receive alignment signals from an external alignment pad (not illustrated).

The first alignment electrode ALE1 may receive a first alignment signal from a first alignment pad. The first alignment signal may be, for example, a ground voltage. The 2-1-th alignment electrode ALE2_1 may receive, from a second alignment pad, a second alignment signal different from the first alignment signal. The second alignment signal may be, for example, an AC voltage. The 2-2-th alignment electrode ALE2_2 may be electrically connected to the 2-1-th alignment electrode ALE2_1 and supplied with an alignment signal identical with that of the 2-1-th alignment electrode ALE2_1, e.g., the second alignment signal. The third alignment electrode ALE3 may receive a first alignment signal from the first alignment pad or another alignment pad. The same first alignment signal may be applied to the first alignment electrode ALE1 and the third alignment electrode ALE3.

In case that the first, 2-1-th, 2-2-th, and third alignment electrodes ALE1, ALE2_1, ALE2_2, and ALE3 are respectively supplied with corresponding alignment signals, electric fields may be respectively formed between the first alignment electrode ALE1 and the 2-1-th alignment electrode ALE2_1 and between the 2-2-th alignment electrode ALE2_2 and the third alignment electrode ALE3. Therefore, the light emitting elements LD may be aligned between the first alignment electrode ALE1 and the 2-1-th alignment electrode ALE2_1 and between the 2-2-th alignment electrode ALE2_2 and the third alignment electrode ALE3. Here, the third conductive pattern CP3 having an expanded shape sufficient to cover the first and second line components LP1 and LP2 that are adjacent to the bank BNK and are disposed under the third conductive pattern CP3 is electrically connected to the first alignment electrode ALE1 through the third contactor CNT3. Hence, the first alignment signal applied to the first alignment electrode ALE1 may be applied to the third conductive pattern CP3. Therefore, the third conductive pattern CP3 may block an electric field induced from the first and second line components LP1 and LP2 disposed thereunder and prevent the light emitting elements LD from being removed from the aligned positions, so that the number of valid light sources of the pixel PXL may be increased.

After the alignment of the light emitting elements LD has been completed, a portion of the first alignment electrode ALE1 and a portion of the third alignment electrode ALE3 may be removed from the second opening OP2 (or the electrode separation area) of the bank BNK. Accordingly, each of the pixels PXL arranged on an identical pixel column in the second direction DR2 may include the first and third alignment electrodes ALE1 and ALE3 each of which may be separated by each pixel PXL.

Figure 13:
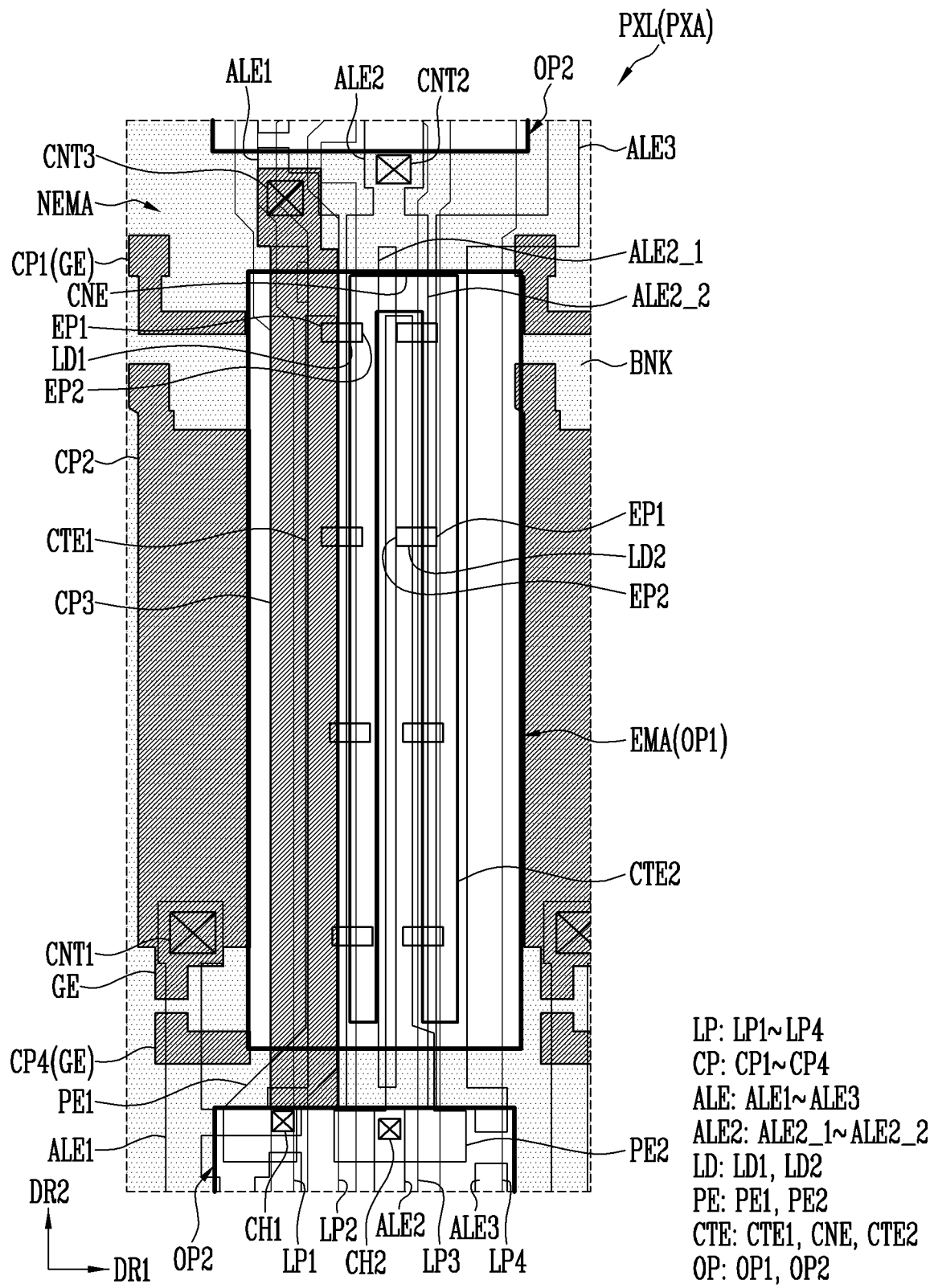
FIG. 13 is a schematic plan view of the pixel in accordance with an embodiment.

FIG. 13 is a schematic plan view of the pixel PXL in accordance with an embodiment.

In an embodiment of FIG. 13, an emission unit (refer to "EMU" of FIG. 4) including two serial sets may be formed by changing designs of the pixel electrodes PE. The structure of the emission unit EMU may be changed in various ways by changing the designs of the pixel electrodes PE.

With regard to an embodiment of FIG. 13, the following description will be focused on differences from that of the foregoing embodiments, to avoid redundant explanation. Components which are not separately explained in the following description of the embodiment may comply with those of the foregoing embodiments. The same reference numeral will be used to designate the same component, and a similar reference numeral will be used to designate a similar component.

Referring to FIGS. 3, 4, and 13, the configuration of the emission unit EMU of the pixel PXL may be changed by changing the designs of the pixel electrode PE and the intermediate electrode CTE. For example, the number of serial sets (or stages) that form the emission unit EMU may be changed by changing the shapes, positions, numbers and/or connection structures of the pixel electrode PE and the intermediate electrode CTE. For example, an emission unit EMU including two serial sets may be formed by changing the designs of the pixel electrode PE and the intermediate electrode CTE.

The pixel electrode PE may include a first pixel electrode PE1 and a second pixel electrode PE2.

The first pixel electrode PE1 may overlap the first alignment electrode ALE1 and the first ends EP1 of the first light emitting elements LD1 aligned between the first and 2-1-th alignment electrodes ALE1 and ALE2_1. The first pixel electrode PE1 may be directly electrically connected to the first alignment electrode ALE1 through the first contact hole CH1, and electrically connected to one or more components, e.g., the first transistor T1, of the pixel circuit PXC by the first alignment electrode ALE1.

The second pixel electrode PE2 may overlap the 2-2-th alignment electrode ALE2_2 and the second ends EP2 of the second light emitting elements LD2 aligned between the 2-2-th and third alignment electrodes ALE2_2 and ALE3. In an embodiment, the second pixel electrode PE2 may be directly electrically connected to the second alignment electrode ALE2 (or the 2-2-th alignment electrode ALE2_2) through the second contact hole CH2, and electrically connected to one or more components, e.g., the fourth line component LP4, of the pixel circuit PXC by the second alignment electrode ALE2.

The intermediate electrode CTE may include a first intermediate electrode CTE1, a second intermediate electrode CTE2, and a connection electrode CNE. The first intermediate electrode CTE1, the second intermediate electrode CTE2, and the connection electrode CNE may be integrally provided and electrically connected with each other. In an embodiment, the first intermediate electrode CTE1, the second intermediate electrode CTE2, and the connection electrode CNE may be different areas of the intermediate electrode CTE.

The first intermediate electrode CTE1 may overlap the second ends EP2 of the first light emitting elements LD1 and at least one area of the 2-1-th alignment electrode ALE2_1 corresponding to the second ends EP2. The first intermediate electrode CTE1 may be brought into direct or indirect contact with and may be electrically connected to the second ends EP2 of the first light emitting elements LD1. In a plan view, the first intermediate electrode CTE1 may have a shape extending in the second direction DR2 between the first pixel electrode PE1 and the second pixel electrode PE2.

The second intermediate electrode CTE2 may overlap the first ends EP1 of the second light emitting elements LD2 and the third alignment electrode ALE3 corresponding to the first ends EP1. The second intermediate electrode CTE2 may be brought into direct or indirect contact with and may be electrically connected to the first ends EP1 of the second light emitting elements LD2. In a plan view, the second intermediate electrode CTE2 may have a shape extending in the second direction DR2 between the second pixel electrode PE2 and the bank BNK.

The connection electrode CNE may be provided between the first intermediate electrode CTE1 and the second intermediate electrode CTE2.

In a plan view, the intermediate electrode CTE including the first intermediate electrode CTE1, the connection electrode CNE, and the second intermediate electrode CTE2 may be spaced apart from the first and second pixel electrodes PE1 and PE2, and have a partially open shape enclosing the periphery (or the perimeter) of the second pixel electrode PE2, but the disclosure is not limited thereto. In an embodiment, the intermediate electrode CTE may have a closed loop shape enclosing the periphery (or the perimeter) of the second pixel electrode PE2. The shape of the intermediate electrode CTE may be changed in various ways within a range in which two successive serial sets may be reliably electrically connected to each other.

The first pixel electrode PE1, the intermediate electrode CTE, the second pixel electrode PE2 may be spaced apart from each other in a plan view.

The pixel PXL may include an emission unit EMU formed of two serial sets.

In an embodiment, a conductive pattern electrically connected to an alignment electrode may be disposed on the initialization power line and the data line, so that an electric field induced by signals respectively applied to the initialization power line and the data line may be blocked.

Hence, in case that light emitting elements are aligned, influence of the electric field on the light emitting elements may be mitigated or minimized, so that the light emitting elements may be prevented from being removed from correct positions, and misalignment of the light emitting elements may be prevented from occurring.

The effects of an embodiment of the disclosure are not limited by the foregoing, and other various effects are anticipated herein.

While various embodiments have been described above, those skilled in the art will appreciate that various modifications, additions and substitutions are possible, without departing from the scope and spirit of the disclosure.

Therefore, the embodiments disclosed in this specification are only for illustrative purposes rather than limiting the spirit of the disclosure.

What is claimed is:

1. A pixel comprising:
   a first line component, a second line component, a third line component, and a fourth line component that are spaced apart from each other on a substrate and extend in a direction;
   a conductive pattern disposed on the first and the second line components;
   a passivation layer disposed on the conductive pattern;
   a first electrode disposed on the passivation layer and directly contacting the conductive pattern;
   a second electrode disposed adjacent to the first electrode and spaced apart from the first electrode;
   a third electrode disposed adjacent to the second electrode and spaced apart from the second electrode, the third electrode being electrically connected to the third line component;
   a first pixel electrode and a second pixel electrode that are disposed on the first electrode, the second electrode, and the third electrode and spaced apart from each other; and
   light emitting elements electrically connected to the first and the second pixel electrodes.

2. The pixel according to claim 1, further comprising:
   an emission area in which the light emitting elements are disposed;
   a non-emission area disposed adjacent to the emission area; and
   a bank disposed in the non-emission area, the bank including:
     a first opening corresponding to the emission area; and
     a second opening spaced apart from the first opening,
   wherein each of the first and the third electrodes is divided into parts in the second opening.

3. The pixel according to claim 2, wherein:
   the first line component comprises an initialization power line to which an initialization voltage is applied,
   the second line component comprises a data line to which a data voltage is applied,
   the third line component comprises a second power line to which a second power supply is applied,
   the fourth line component comprises a first power line to which a first power supply different from the second power supply is applied,
   the first power supply is a high-potential driving power supply, and
   the second power supply is a low-potential driving power supply.

4. The pixel according to claim 3, further comprising:
a buffer layer disposed on the substrate;
a gate insulating layer disposed on the buffer layer;
an interlayer insulating layer disposed on the gate insulating layer; and
the passivation layer disposed on the interlayer insulating layer, wherein
the first, the second, the third, and the fourth line components are disposed between the substrate and the buffer layer, and
the conductive pattern is disposed between the gate insulating layer and the interlayer insulating layer.

5. The pixel according to claim 4, wherein the conductive pattern overlaps the first and the second line components.

6. The pixel according to claim 5, wherein the first electrode is formed of a first electrode portion and a contractor successively passing through the passivation layer and the interlayer insulating layer, and the first electrode portion is electrically connected to the conductive pattern through the contactor.

7. The pixel according to claim 6, wherein the contactor overlaps the bank.

8. The pixel according to claim 5, further comprising:
an insulating layer disposed on the first, the second, and the third electrodes, and including:
  a first contact hole formed to expose an area of the first electrode; and
  a second contact hole formed to expose an area of the second electrode, wherein
the first pixel electrode is electrically connected to the first electrode through the first contact hole, and
the second pixel electrode is electrically connected to the second electrode through the second contact hole.

9. The pixel according to claim 8, wherein the first contact hole and the second contact hole are positioned in the second opening of the bank.

10. The pixel according to claim 4, further comprising:
at least one transistor disposed on the buffer layer and electrically connected to the light emitting elements.

11. The pixel according to claim 10, wherein a gate electrode of the at least one transistor and the conductive pattern are disposed on a same layer.

12. The pixel according to claim 2, wherein the second electrode comprises a 2-1-th electrode and a 2-2-th electrode that diverge from the non-emission area to the emission area.

13. The pixel according to claim 1, further comprising:
an intermediate electrode disposed between the first pixel electrode and the second pixel electrode, the intermediate electrode being spaced apart from each of the first pixel electrode and the second pixel electrode.

14. The pixel according to claim 13, wherein the intermediate electrode comprises a first intermediate electrode, a second intermediate electrode, and a third intermediate electrode disposed at positions spaced apart from each other.

15. The pixel according to claim 14, wherein the light emitting elements comprise:
a first light emitting element disposed between the first pixel electrode and the first intermediate electrode, and electrically connected to the first pixel electrode and the first intermediate electrode;
a second light emitting element disposed between the first intermediate electrode and the second intermediate electrode, and electrically connected to the first intermediate electrode and the second intermediate electrode;
a third light emitting element disposed between the second intermediate electrode and the third intermediate electrode, and electrically connected to the second intermediate electrode and the third intermediate electrode; and
a fourth light emitting element disposed between the third intermediate electrode and the second pixel electrode, and electrically connected to the third intermediate electrode and the second pixel electrode.

16. The pixel according to claim 13, wherein:
the intermediate electrode comprises:
  a first intermediate electrode adjacent to the first pixel electrode;
  a second intermediate electrode adjacent to the second pixel electrode; and
  a connection electrode that electrically connects the first intermediate electrode to the second intermediate electrode, and
the first intermediate electrode, the second intermediate electrode, and the connection electrode are integral to each other.

17. The pixel according to claim 16, wherein the light emitting elements comprise:
a first light emitting element disposed between the first pixel electrode and the first intermediate electrode, and electrically connected to the first pixel electrode and the first intermediate electrode; and
a second light emitting element disposed between the second intermediate electrode and the second pixel electrode, and electrically connected to the second intermediate electrode and the second pixel electrode.

18. A display device comprising:
pixel areas each including an emission area and a non-emission area; and
a pixel disposed in each of the pixel areas, the pixel comprising:
a first line component, a second line component, a third line component, and a fourth line component that are spaced apart from each other on a substrate and extend in a direction;
a buffer layer disposed on the first line component, the second line component, the third line component and the fourth line component;
a conductive pattern disposed on a surface of the buffer layer and overlapping the first and the second line components;
a passivation layer disposed on the conductive pattern;
a first electrode disposed on the passivation layer and directly contacting the conductive pattern;
a second electrode disposed adjacent to the first electrode and spaced apart from the first electrode;
a third electrode disposed adjacent to the second electrode and spaced apart from the second electrode, the third electrode being electrically connected to the third line component;
a bank disposed in the non-emission area, the bank including a first opening corresponding to the emission area, and a second opening spaced apart from the first opening;
a first pixel electrode and a second pixel electrode that are disposed on the first electrode, the second electrode, and the third electrode and spaced apart from each other; and
light emitting elements electrically connected to the first and the second pixel electrodes.

19. The display device according to claim 18, wherein:
the first line component comprises an initialization power line to which an initialization voltage is applied, the second line component comprises a data line to which a data voltage is applied, the third line component comprises a second power line to which a second power supply is applied, the fourth line component comprises a first power line to which a first power supply different from the second power supply is applied, the first power supply is a high-potential driving power supply, and the second power supply is a low-potential driving power supply.

20. The display device according to claim 19, wherein:

the first electrode is formed of a first electrode portion and a contractor passing through the passivation layer, and the first electrode portion is electrically connected to the conductive pattern through the contactor, and the contactor overlaps the bank.

* * * * *